(12) United States Patent
Chen et al.

(10) Patent No.: US 12,253,700 B2
(45) Date of Patent: Mar. 18, 2025

(54) DISPLAY APPARATUS

(71) Applicant: Coretronic Corporation, Hsin-Chu (TW)

(72) Inventors: Ping-Yen Chen, Hsin-Chu (TW); Wen-Chun Wang, Hsin-Chu (TW); Chung-Yang Fang, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 377 days.

(21) Appl. No.: 17/743,460

(22) Filed: May 13, 2022

(65) Prior Publication Data

US 2022/0397714 A1 Dec. 15, 2022

Related U.S. Application Data

(60) Provisional application No. 63/208,510, filed on Jun. 9, 2021.

(30) Foreign Application Priority Data

Sep. 28, 2021 (CN) .......................... 202111139992.2

(51) Int. Cl.
*G02B 5/30* (2006.01)
*G02B 5/00* (2006.01)
(Continued)

(52) U.S. Cl.
CPC .......... *G02B 5/3033* (2013.01); *G02B 5/003* (2013.01); *G02B 5/26* (2013.01); *G02B 5/3016* (2013.01);
(Continued)

(58) Field of Classification Search
None
See application file for complete search history.

(56) References Cited

U.S. PATENT DOCUMENTS

| 2003/0127656 A1* | 7/2003 | Aizawa ................. H10K 50/85 257/79 |
| 2007/0257609 A1 | 11/2007 | Fukuda et al. |
| 2013/0215365 A1* | 8/2013 | Huang .............. G02F 1/133528 349/96 |

FOREIGN PATENT DOCUMENTS

| CN | 1871627 | 11/2006 |
| CN | 1908704 | 2/2007 |

(Continued)

OTHER PUBLICATIONS

"Office Action of Taiwan Counterpart Application", issued on May 31, 2022, p. 1-p. 3.

(Continued)

*Primary Examiner* — William C Trapanese
(74) *Attorney, Agent, or Firm* — JCIPRNET

(57) ABSTRACT

Provided is a display apparatus including a circuit substrate, a light-emitting layer, a polarizing layer, a quarter waveplate, and a bandpass polarizing reflective layer. The light-emitting layer includes a plurality of first light-emitting structures. The first light-emitting structures have a first peak emission wavelength. The polarizing layer is located on a side of the light-emitting layer away from the circuit substrate. The quarter waveplate is disposed between the polarizing layer and the light-emitting layer and overlaps the light-emitting layer and the polarizing layer. The bandpass polarizing reflective layer is disposed between the quarter waveplate and the light-emitting layer and includes a first bandpass polarizing reflective pattern overlapping the first light-emitting structures. A reflectance of the bandpass polarizing reflective pattern for light with a wavelength in a first wavelength range is greater than 20%. The first wavelength range is the peak emission wavelength ±10 nm.

13 Claims, 16 Drawing Sheets

(51) Int. Cl.
*G02B 5/26* (2006.01)
*H10K 50/86* (2023.01)
*H10K 59/12* (2023.01)

(52) U.S. Cl.
CPC ......... *G02B 5/3083* (2013.01); *H10K 50/865* (2023.02); *H10K 59/12* (2023.02)

(56) References Cited

FOREIGN PATENT DOCUMENTS

| CN | 103715217 | 4/2014 |
|---|---|---|
| CN | 104460116 | 3/2015 |
| CN | 108288640 | 7/2018 |
| CN | 110137232 | 8/2019 |
| JP | 2003186413 | 7/2003 |
| JP | 2013011827 | 1/2013 |
| TW | 201534999 | 9/2015 |
| TW | 201606393 | 2/2016 |
| WO | 2010024620 | 3/2010 |

OTHER PUBLICATIONS

"Office Action of China Counterpart Application", issued on Jul. 1, 2024, p. 1-p. 8.
"Office Action of China Counterpart Application", issued on Dec. 26, 2024, p. 1-p. 9.

\* cited by examiner

DISPLAY APPARATUS

CROSS-REFERENCE TO RELATED APPLICATION

This application claims the priority benefits of U.S. provisional Ser. No. 63/208,510 filed on Jun. 9, 2021 and China application serial no. 202111139992.2 filed on Sep. 28, 2021. The entirety of the above-mentioned patent applications is hereby incorporated by reference herein and made a part of this specification.

BACKGROUND

Technical Field

The invention relates to an electronic apparatus, particularly to a display apparatus.

Description of Related Art

In recent years, organic light-emitting diode (OLED) display panels and micro LED display panels are becoming popular choices due to their high color saturation, fast response time, and high-contrast display quality. To increase the luminous efficiency of such self-luminous display panels, most of the electrodes on the side of the light-emitting diode away from the light-emitting surface of the self-luminous display panel are reflective electrodes. Since such reflective electrodes reflect ambient light, human eyes can easily perceive the ambient light reflected by the reflective electrodes when the display panel presents a black image or when the image is partially dark, resulting in poor display quality or appearance quality.

A technical solution has been proposed to solve this problem by providing a circular polarizer on one side of the light-emitting surface of the self-luminous display panel. The circular polarizer transforms the passing ambient light into circularly polarized light. After being reflected by the reflective electrode, the circularly polarized light is then transformed into a reversed circularly polarized light which cannot pass through the circular polarizer. The reflectance of such self-luminous display panels to ambient light may thus be reduced. However, this type of circular polarizer tends to reduce the overall optical output of the self-luminous display panel by, for example, at least 55%.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The present invention provides a display apparatus that takes both the light energy utilization rate and the contrast in the dark state into account.

In order to achieve one or part or all of the above objectives or other objectives, an embodiment of the present invention provides a display apparatus. The display apparatus includes a circuit substrate, a light-emitting layer, a polarizing layer, a quarter waveplate, and a bandpass polarizing reflective layer. The light-emitting layer is disposed on the circuit substrate and has a plurality of light-emitting structures. The light-emitting structures are electrically connected to the circuit substrate and include a plurality of first light-emitting structures. The first light-emitting structures have a first peak emission wavelength. The polarizing layer overlaps the light-emitting layer and is located on a side of the light-emitting layer away from the circuit substrate. The quarter waveplate is disposed between the polarizing layer and the light-emitting layer, and overlaps the light-emitting layer and the polarizing layer. The bandpass polarizing reflective layer is disposed between the quarter waveplate and the light-emitting layer. The bandpass polarizing reflective layer includes a first bandpass polarizing reflective pattern overlapping the first light-emitting structures. The reflectance of the first bandpass polarizing reflective pattern for light with a wavelength in the first wavelength range is greater than 20%. The first wavelength range is the first peak emission wavelength ±10 nm.

Based on the above, in the display apparatus of an embodiment of the present invention, the bandpass polarizing reflective layer is provided between the quarter waveplate and the light-emitting layer and overlaps the light-emitting structures. Accordingly, the overall reflectance of the display apparatus to ambient light may be reduced effectively, and the light energy loss of the internal display light of the polarizing layer may be reduced, thereby improving the light energy utilization rate and the performance of the display apparatus in the dark state.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
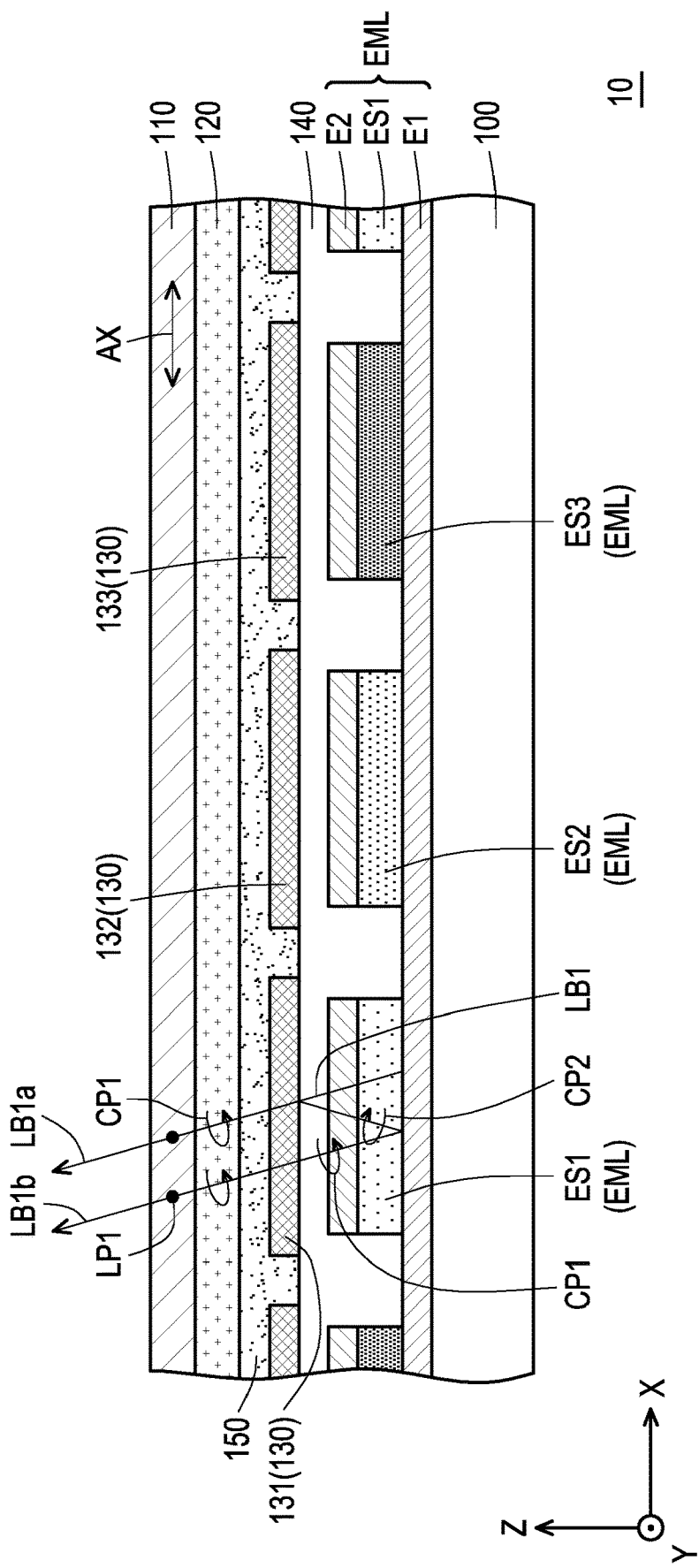
FIG. 1A to FIG. 1C are schematic cross-sectional views of a display apparatus according to a first embodiment of the invention.
Figure 1B:
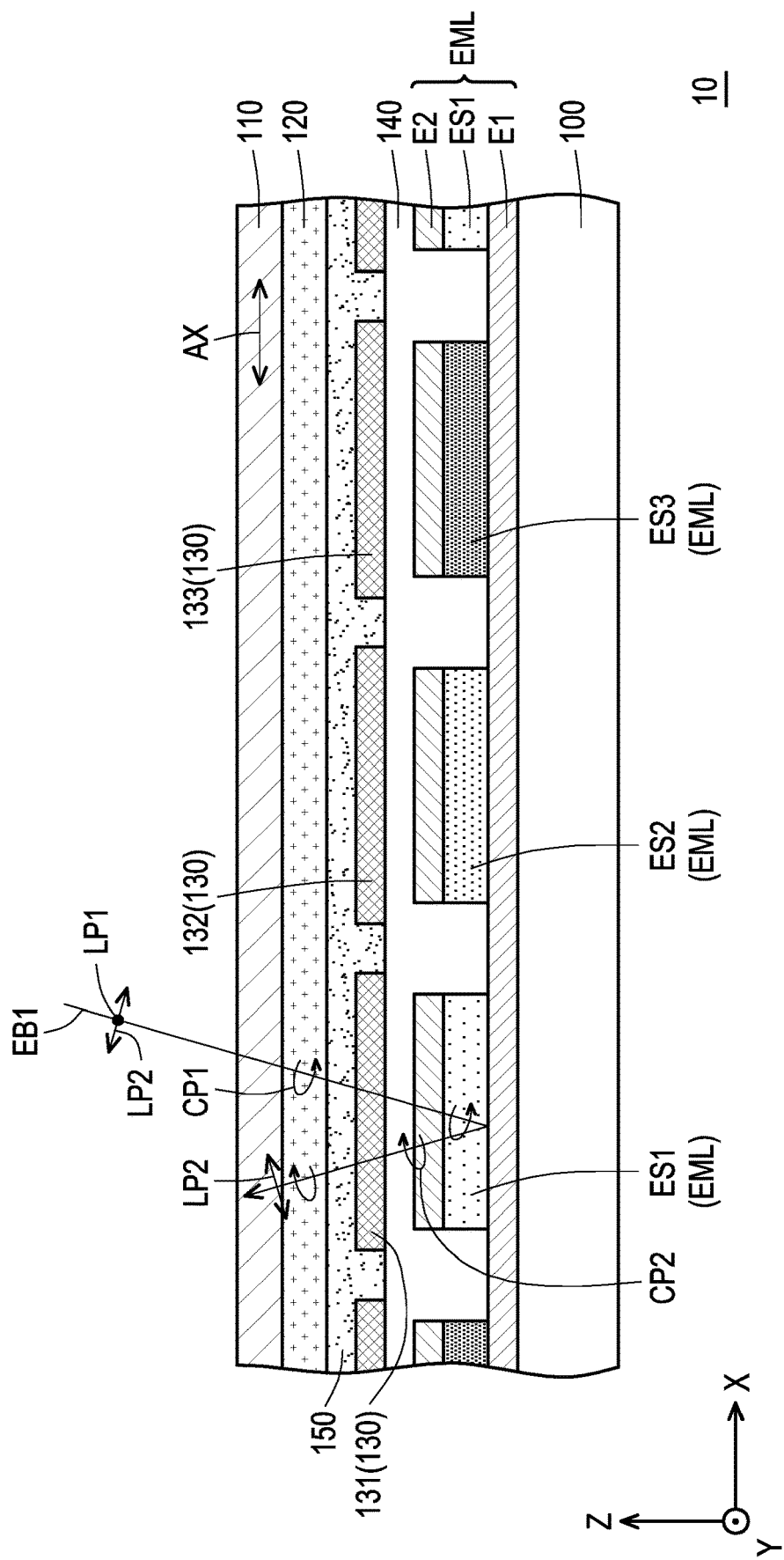
Figure 1C:
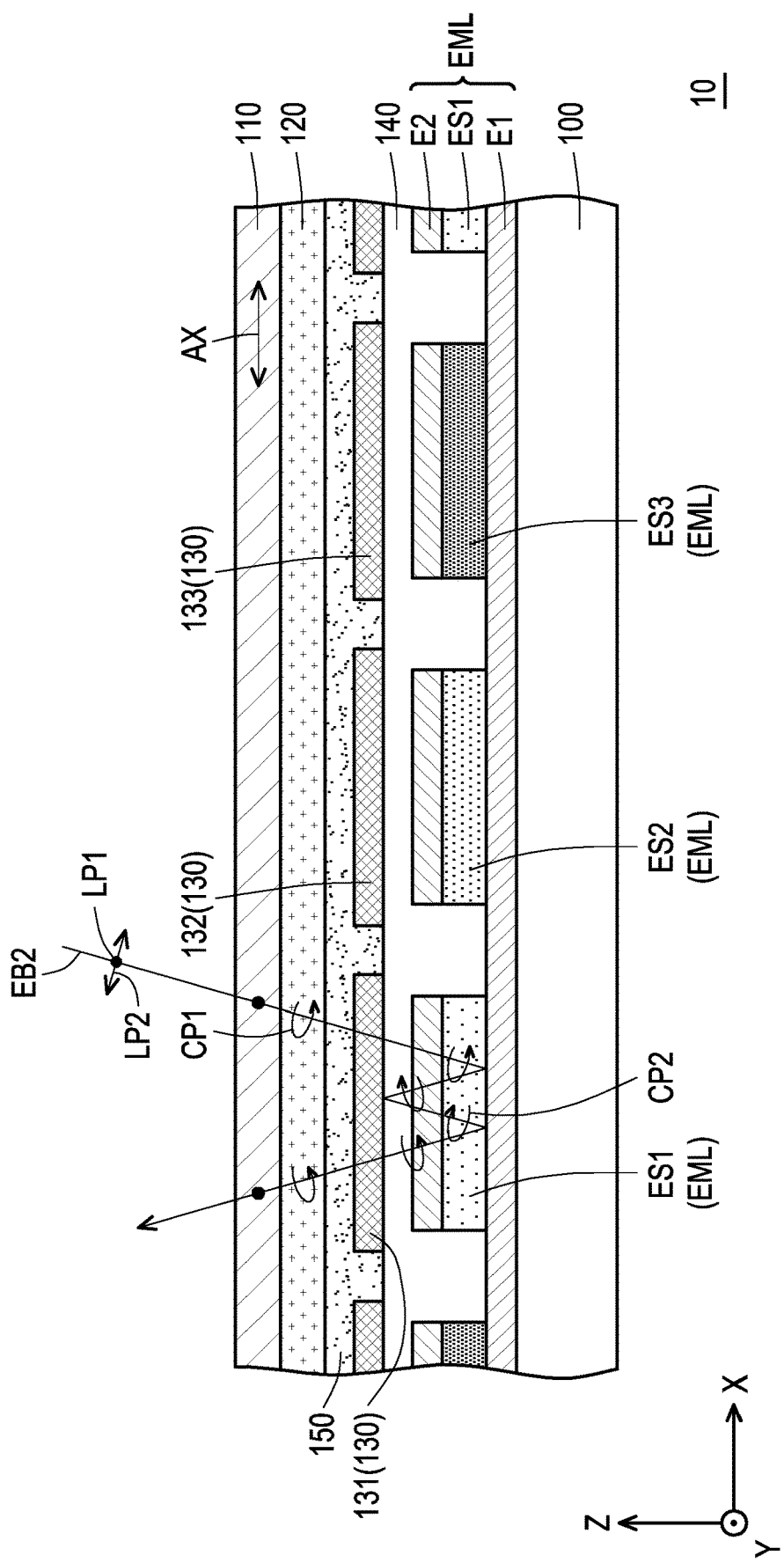
Figure 2:
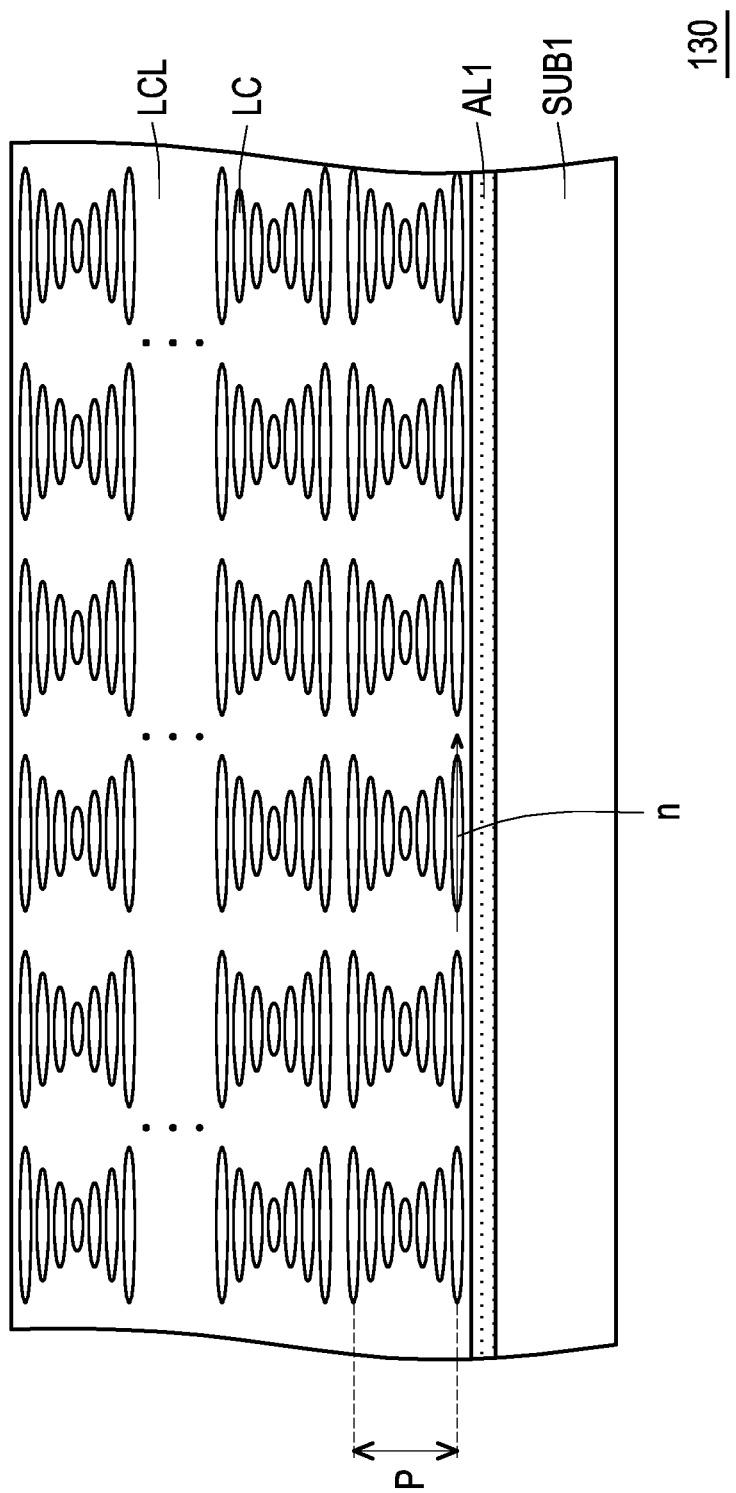
FIG. 2 is a schematic cross-sectional view of the bandpass polarizing reflective layer according to the first embodiment of the present invention.
Figure 3A:
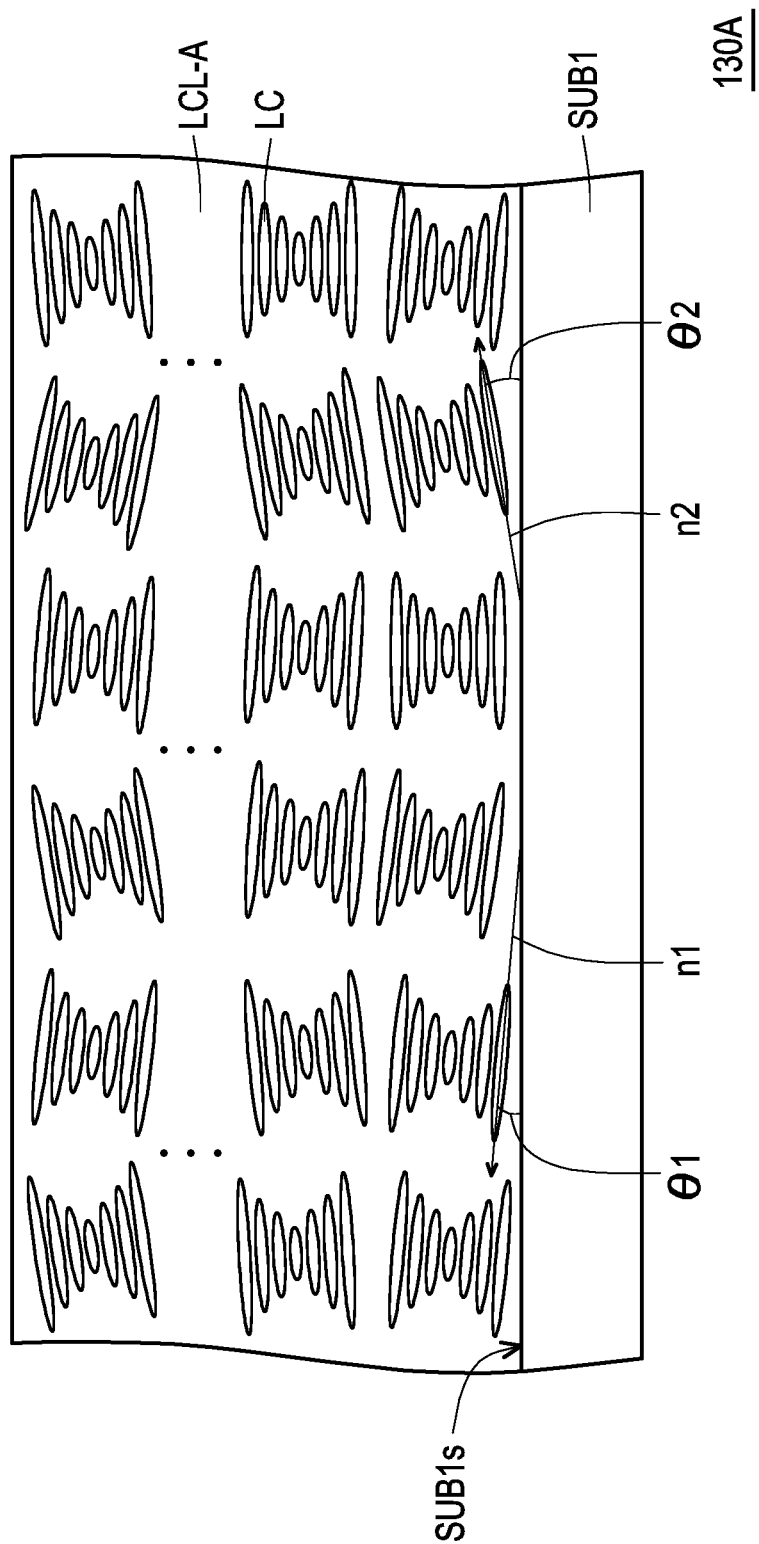
FIG. 3A and FIG. 3B are schematic cross-sectional views of modifications of the bandpass polarizing reflective layer in FIG. 2.
Figure 3B:
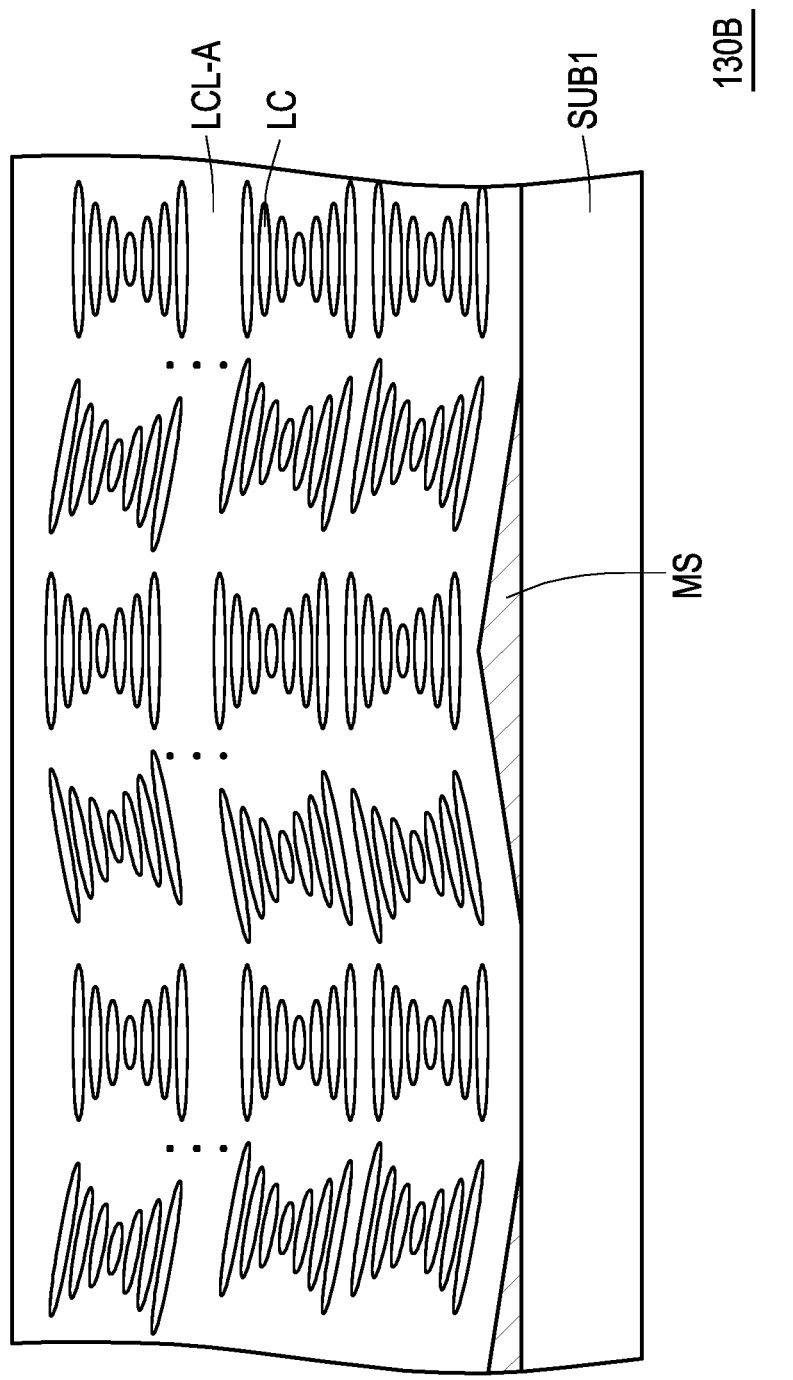

FIG. 1A to FIG. 1C are schematic cross-sectional views of a display apparatus according to a first embodiment of the invention. FIG. 2 is a schematic cross-sectional view of the bandpass polarizing reflective layer according to the first embodiment of the present invention. FIG. 3A and FIG. 3B are schematic cross-sectional views of modifications of the bandpass polarizing reflective layer in FIG. 2.

In FIG. 1A, the display apparatus 10 includes a circuit substrate 100, a light-emitting layer EML, a polarizing layer 110, and a quarter waveplate 120. The light-emitting layer EML is disposed on the circuit substrate 100. The light-emitting layer EML has a plurality of light-emitting structures and electrode layers, and the light-emitting structures are electrically coupled to the circuit substrate 100. In this embodiment, the circuit substrate 100 includes, for example, a driving circuit layer (not shown) that individually controls a plurality of display pixels. Furthermore, the light-emitting layer EML may include a plurality of light-emitting structures ES1, a plurality of light-emitting structures ES2, a plurality of light-emitting structures ES3, a first electrode layer E1, and a second electrode layer E2. The light-emitting structures ES1, the light-emitting structures ES2, and the light-emitting structures ES3 are, for example, alternately disposed in sequence along a direction X and serve as a plurality of display pixels. The light-emitting structures disposed along a direction Y are, for example, the same light-emitting structures or they are disposed alternately, to which the present invention is not limited. In other embodiments, the display apparatus 10 may be a monochrome grayscale display or a black-and-white grayscale display, which means that the display apparatus 10 may only include one type of light-emitting structures.

Furthermore, the light-emitting structures ES1, the light-emitting structures ES2, and the light-emitting structures ES3 are adapted to respectively emit excitation light with different peak emission wavelengths (for example, 620 nm, 525 nm, 460 nm), such as red light (for example, light with a peak emission wavelength greater than 600 nm), green light (for example, light with a peak emission wavelength between 500 nm and 600 nm), and blue light (such as light with a peak emission wavelength less than 500 nm), and these lights are mixed with different light intensity ratios to achieve the effect of color display. In other words, the display apparatus 10 of this embodiment is a self-luminous display, such as an organic light-emitting diode (OLED) display, but it is not limited thereto. In other embodiments, the display apparatus 10 may also be a micro light-emitting diode (micro-LED) display or a mini light emitting diode (mini-LED) display.

In this embodiment, the first electrode layer E1 and the second electrode layer E2 are respectively disposed on opposite sides of the light-emitting structures, and the two electrode layers are electrically connected to those light-emitting structures. For example, the first electrode layer E1 is located between the light-emitting structures and the circuit substrate 100, and is, for example, a full-surface electrode. The second electrode layer E2 is, for example, a plurality of electrode patterns respectively disposed to overlap the light-emitting structures, and these electrode patterns are respectively electrically connected to a plurality of active devices (not shown) of the circuit substrate 100. More specifically, the current flowing through the light-emitting structures is individually controlled via the active devices to generate the same or different light-emission intensity to achieve the display effect.

The first electrode layer E1 is, for example, a reflective electrode layer. The material of the reflective electrode layer includes metals, alloys, nitrides of metallic materials, oxides of metallic materials, oxynitrides of metallic materials, other suitable materials, or stacked layers of metallic materials and other conductive materials. The second electrode layer E2 is, for example, a light-transmitting electrode layer. The material of the light-transmitting electrode layer includes metal oxides, such as indium tin oxide, indium zinc oxide, aluminum tin oxide, aluminum zinc oxide, other suitable oxides, or a stack of at least two of the foregoing materials.

In this embodiment, the polarizing layer 110 has an absorption axis AX, and the included angle between an axial direction of the absorption axis AX and an axial direction of the optical axis (not shown, fast axis or slow axis) of the quarter waveplate 120 is 45 degrees. The polarizing layer 110 overlaps the light-emitting layer EML, and is located on the side of the light-emitting layer EML away from the circuit substrate 100. The quarter waveplate 120 of the display apparatus 10 overlaps a plurality of light-emitting structures (such as the light-emitting structures ES1, the light-emitting structures ES2, and the light-emitting structures ES3) of the light-emitting layer EML and the polarizing layer 110, and it is located between the polarizing layer 110 and the light-emitting layer EML. It is worth mentioning that the quarter waveplate 120 of the invention may be a combination of multilayer compensation films, such as a combination of a quarter waveplate and a half wave plate. In this embodiment, in order to protect the light-emitting layer EML, the display apparatus 10 may also optionally include an encapsulation layer 140 disposed between the light-emitting layer EML and the quarter waveplate 120, and the encapsulation layer 140 covers the light-emitting layer EML, but it is not limited thereto.

Furthermore, the display apparatus 10 further includes a bandpass polarizing reflective layer 130 and a light-transmitting adhesive layer 150 disposed between the quarter waveplate 120 and the light-emitting layer EML. In this embodiment, the bandpass polarizing reflective layer 130 may include a plurality of bandpass polarizing reflective patterns, such as a plurality of bandpass polarizing reflective patterns 131, a plurality of bandpass polarizing reflective patterns 132, and a plurality of bandpass polarizing reflective patterns 133 disposed alternately along the direction X. The light-transmitting adhesive layer 150 covers these bandpass polarizing reflective patterns.

More specifically, the bandpass polarizing reflective patterns 131 respectively overlap the light-emitting structures ES1, the bandpass polarizing reflective patterns 132 respectively overlap the light-emitting structures ES2, and the bandpass polarizing reflective patterns 133 respectively overlap the light-emitting structures ES3. Note here that the description of two members overlapping each other means that the projections of the two members along the direction Z overlap. If it is not specifically indicated below, how two members overlap is defined as such, and the same explanation is not provided hereinafter.

In this embodiment, the reflectance of the bandpass polarizing reflective patterns 131 is greater than 20% for light with a wavelength in a first wavelength range, and the first wavelength range is the peak emission wavelength of the light-emitting structures ES1 ±10 nm (for example, 610 nm to 630 nm). The reflectance of the bandpass polarizing reflective patterns 132 is greater than 20% for light with a wavelength in the second wavelength range, and the second wavelength range is the peak emission wavelength of the light-emitting structures ES2 ±10 nm (for example, 515 nm to 535 nm). The peak emission wavelength of the light-emitting structures ES1 is different from the peak emission wavelength of the light-emitting structures ES2. The reflectance of the bandpass polarizing reflective patterns 133 is greater than 20% for light with a wavelength in a third wavelength range, and the third wavelength range is the peak emission wavelength of the light-emitting structures ES3 ±10 nm (for example, 450 nm to 470 nm).

It should be noted that each of these bandpass polarizing reflective patterns does not substantially reflect light with wavelengths outside the wavelength range (for example, the reflectance of the bandpass polarizing reflective patterns is less than 5% for light with a wavelength outside the wavelength range), and the reflectance of the bandpass polarizing reflective patterns is greater than 20% for light with a wavelength in the wavelength range For example, a non-polarized light LB1 (within the first wavelength range) emitted by the light-emitting structures ES1 enters the bandpass polarizing reflective patterns 131. Part of the light LB1 directly passes through the bandpass polarizing reflective patterns 131 and forms a light LB1a with a first circular polarization state CP1, whereas the other part of the light LB1 is reflected by the bandpass polarizing reflective patterns 131 and forms a light LB1b with the second circular polarization state CP2. In other words, the bandpass polarizing reflective patterns 131 reflect the light component with the second circular polarization state CP2 in the light LB1, and allows the light component with the first circular polarization state CP1 in the light LB1 to pass.

After the light LB1a from the bandpass polarizing reflective patterns 131 pass through the quarter waveplate 120, its polarization state is converted from the first circular polarization state CP1 to a first linear polarization state LP1. Since the polarization direction of the first linear polarization state LP1 is perpendicular to the axis of the absorption axis AX of the polarizing layer 110, the light LB1a may directly pass through the polarizing layer 110 and exit the display apparatus 10. In contrast, the light LB1b reflected by the bandpass polarizing reflective patterns 131 change its polarization state from the second circular polarization state CP2 to the first circular polarization state CP1 after being reflected by the first electrode layer E1. At this time, the light LB1b with the first circular polarization state CP1 may directly pass through the bandpass polarizing reflective patterns 131 and pass through the quarter waveplate 120 to form the light LB1b with the first linear polarization state LP1. Therefore, the light LB1b reflected by the bandpass polarizing reflective patterns 131 and the first electrode layer E1 may also pass through the polarizing layer 110 and exit the display apparatus 10. In other words, the substantial light energy of the light LB1 emitted by the light-emitting structures ES1 is not lost due to the configuration of the bandpass polarizing reflective patterns 131.

Since the effect of the bandpass polarizing reflective patterns 132 on the light emitted by the light-emitting structures ES2 and the effect of the bandpass polarizing reflective patterns 133 on the light emitted by the light-emitting structures ES3 are similar to the effect of the bandpass polarizing reflective patterns 131 on the light LB1, the same is not repeated herein.

On the other hand, in FIG. 1B, non-polarized ambient light EB1 from the outside forms light with the first circular polarization state CP1 after passing through the polarizing layer 110 and the quarter waveplate 120. It should be noted that when the wavelength of the ambient light EB1 is outside the first wavelength range, the bandpass polarizing reflective patterns 131 do not substantially reflect the ambient light EB1 regardless of the polarization state of the ambient light EB1. For example, both the ambient light EB1 having the first circular polarization state CP1 that passes through the polarizing layer 110 and the quarter waveplate 120 and the ambient light EB1 having the second circular polarization state CP2 reflected by the first electrode layer E1 can directly pass through the bandpass polarizing reflective patterns 131.

After the ambient light EB1 from the bandpass polarizing reflective patterns 131 passes through the quarter waveplate 120, its polarization state is converted from the second circular polarization state CP2 to a second linear polarization state LP2. Since the polarization direction of the second linear polarization state LP2 is parallel to the axis of the absorption axis AX of the polarizing layer 110, the ambient light EB1 reflected by the first electrode layer E1 cannot exit the display apparatus 10. For example, the ambient light EB1 may be green light or blue light with a wavelength outside the first wavelength range, but it is not limited thereto.

In FIG. 1C, when the wavelength of the ambient light EB2 is within the first wavelength range, part of the ambient light EB2 exits the display apparatus 10 after reflected by the bandpass polarizing reflective patterns 131 and the first electrode layer E1. Specifically, after passing through the polarizing layer 110 and the quarter waveplate 120, the ambient light EB2 forms a light with the first circular polarization state CP1. After the ambient light EB2 with the first circular polarization state CP1 passes through the bandpass polarizing reflective patterns 131 and is reflected by the first electrode layer E1, its polarization state is converted from the first circular polarization state CP1 to the second circular polarization state CP2. The ambient light EB2 with the second circular polarization state CP2 can therefore be reflected back to the first electrode layer E1 by the bandpass polarizing reflective patterns 131. And then after going through the second reflection of the first electrode layer E1, the ambient light EB2 becomes a light with the first circular polarization state CP1. After the ambient light EB2 with the first circular polarization state CP1 passes through the bandpass polarizing reflective patterns 131 and the quarter waveplate 120 again, light with the first linear polarization state LP1 is formed, and it exits the display apparatus 10 through the polarizing layer 110.

Since the effect of the bandpass polarizing reflective patterns 132 and the bandpass polarizing reflective patterns 133 on the ambient light is similar to the effect of the bandpass polarizing reflective patterns 131 on the ambient light, the same description is repeated here.

Please refer to FIG. 1A to FIG. 1C at the same time. The configuration of the bandpass polarizing reflective patterns 131 reduces the reflectance of the display apparatus 10 to the ambient light EB1 effectively. Although it may not completely suppress the reflection of the ambient light EB2 whose wavelength is within the aforementioned first wavelength range, the reflection of the ambient light EB2 may still be substantially suppressed since the ambient light EB2 in the display apparatus 10 undergoes two reflections of the first electrode layer E1 that causes substantial light energy loss. In other words, the above configuration may reduce the overall reflectance of the display apparatus 10 to ambient light, and help improve the display quality (of the dark image or of the display contrast, for example) of the display apparatus 10.

Furthermore, although the general display apparatus only requires the structure of the polarizing layer and the quarter waveplate to suppress the reflection of ambient light, but it also makes the light from the internal light-emitting element lose light energy (for example, attenuation of more than 50% of display brightness) at the same time. Therefore, the configuration of the bandpass polarizing reflective patterns 131 of this embodiment may reduce the overall reflectance of the display apparatus 10 to ambient light, and it may also reduce the energy loss of the internal display light (for example, the light LB1) due to the configuration of the polarizing layer 110 and the quarter waveplate 120 in the display apparatus 10. In other words, the light energy utilization rate and display quality of the display apparatus 10 may be improved at the same time.

In FIG. 2, in this embodiment, the bandpass polarizing reflective layer 130 includes, for example, a substrate SUB1 and a cholesteric liquid crystal layer LCL. The cholesteric liquid crystal layer LCL is disposed on the substrate SUB1 and has a plurality of liquid crystal molecules LC. These liquid crystal molecules LC form a twist with a pitch P on the substrate SUB1, for example. Specifically, the product of the average refractive index of the cholesteric liquid crystal layer LCL and the pitch P is equal to the peak of the reflection wavelength. In other words, in order to correspond to the peak emission wavelengths of different light-emitting structures, the pitch P of the cholesteric liquid crystal layer LCL of the bandpass polarizing reflective patterns 131, the bandpass polarizing reflective patterns 132, and the bandpass polarizing reflective patterns 133 are all different from one another.

Furthermore, the bandpass polarizing reflective layer 130 may optionally include an alignment layer AL1, which is disposed between the cholesteric liquid crystal layer LCL and the substrate SUB1. Therefore, the liquid crystal molecules LC of the cholesteric liquid crystal layer LCL adjacent to the alignment layer AL1 are generally aligned in the alignment direction, and the included angles (for example, an angle close to 0 degrees) between the axis direction of the molecular long axis n (or the optical axis) and a film surface of the alignment layer AL1 are roughly the same.

However, the invention is not limited thereto. As shown in FIG. 3A, in other embodiments, it is possible that the alignment layer is not provided on the substrate SUB1 of the bandpass polarizing reflective layer 130A. The diversity of the included angle between a surface SUB1s of the substrate SUB1 and the axis direction of the optical axis of the liquid crystal molecules LC in different regions in the cholesteric liquid crystal layer LCL-A are therefore increased. For example, the angle θ1 between the molecular long axis n1 of part of the liquid crystal molecules LC and the surface SUB1s of the substrate SUB1 is substantially different from the angle θ2 between the long axis n2 of the molecular axis of the other part of the liquid crystal molecules LC and the surface SUB1s of the substrate SUB1. That is, the cholesteric liquid crystal layer LCL-A has different inclination angles of the liquid crystal molecules LC in the regions of the liquid crystal molecules LC relative to the substrate SUB1. Accordingly, it is possible to suppress changes in the reflectance of the display apparatus to ambient light under different viewing angles. In the embodiment of the present invention, the substrate may also be removed to reduce the thickness if the substrate and the cholesteric liquid crystal layer are weakly bonded.

In another embodiment, as shown in FIG. 3B, the bandpass polarizing reflective layer 130B may also optionally include a plurality of surface microstructures MS, and these surface microstructures MS are disposed on the substrate SUB1. For example, the surface microstructures MS are disposed between the substrate SUB1 and the cholesteric liquid crystal layer LCL-A as shown in FIG. 3B. The configuration of the surface microstructures MS may bring more orderly changes to the included angles between the molecular long axes of the liquid crystal molecules LC of the cholesteric liquid crystal layer LCL-A and the substrate. For example, the appearance or pitch of these surface microstructures MS may be adjusted to control the reflectance of the display apparatus to ambient light under different viewing angles.

Other embodiments are listed below to describe the disclosure in detail. The same components are marked with the same symbols, and the description of the same technical content is omitted. Please refer to the foregoing embodiments for the omitted parts as they are not repeated hereafter.

Figure 4:
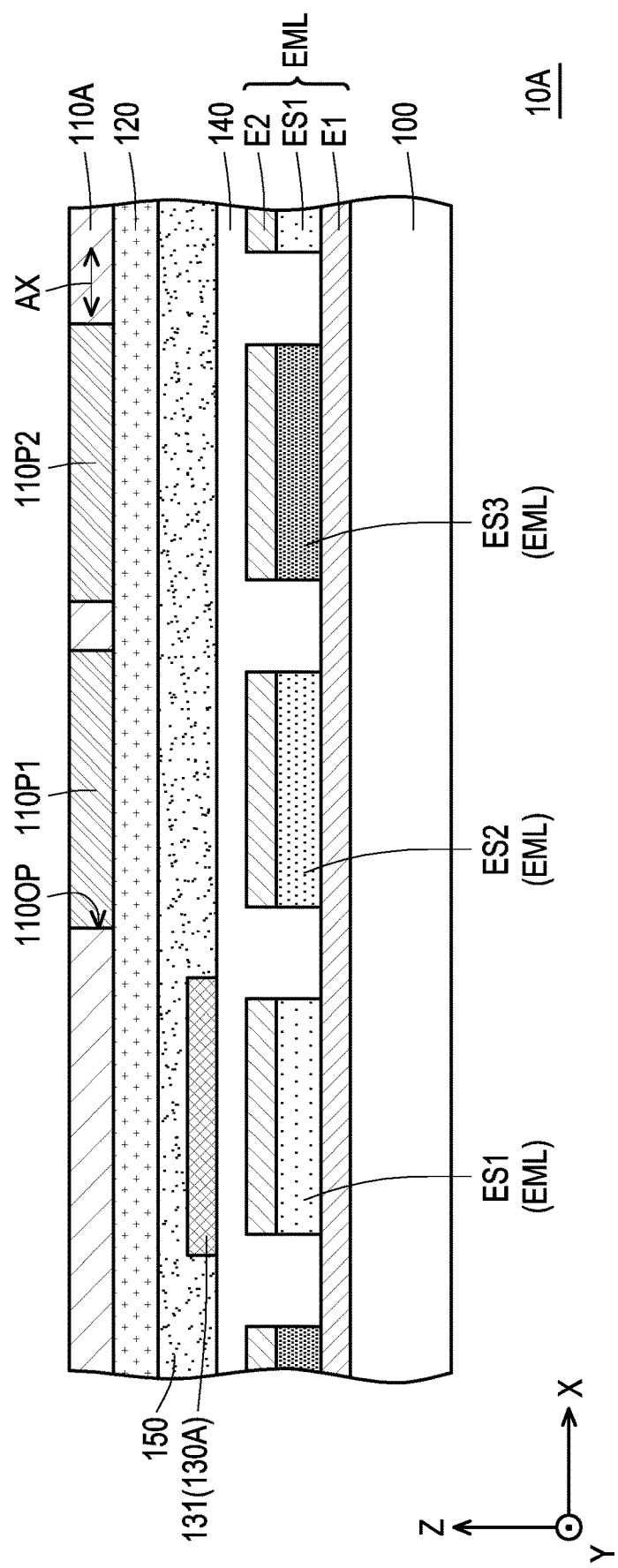
FIG. 4 is a schematic cross-sectional view of a display apparatus according to a second embodiment of the invention.

FIG. 4 is a schematic cross-sectional view of a display apparatus according to a second embodiment of the invention. The difference between the display apparatus 10A in FIG. 4 of this embodiment and the display apparatus 10 in FIG. 1A lies in the configuration of the bandpass polarizing reflective layer and the polarizing layer. Specifically, the bandpass polarizing reflective layer 130A of the display apparatus 10A only has a plurality of bandpass polarizing reflective patterns 131. That is, the bandpass polarizing reflective layer 130A does not have the bandpass polarizing reflective patterns 132 and the bandpass polarizing reflective patterns 133 overlapping the light-emitting structures ES2 and the light-emitting structures ES3 as shown in FIG. 1A.

In contrast, the polarizing layer 110A of this embodiment has a plurality of openings 110OP overlapping a plurality of light-emitting structures ES2 and a plurality of light-emitting structures ES3. A plurality of bandpass polarizing patterns are provided in the openings 110OP. For example, the opening 110OP overlapping the light-emitting structures ES2 is provided with a bandpass polarizing pattern 110P1, and the opening 110OP overlapping the light-emitting structures ES3 is provided with a bandpass polarizing pattern 110P2. And the absorption axis (not shown) of these bandpass polarizing patterns and the absorption axis AX of the polarizing layer 110A are parallel or perpendicular.

For example, in this embodiment, the bandpass polarizing pattern 110P1 has a relatively insignificant polarization effect on light with a wavelength in the second wavelength range (aforementioned). Therefore, the maximum transmittance of the bandpass polarizing pattern 110P1 for light with a wavelength in the second wavelength range may be greater than 45%, or even above 70%. On the contrary, the bandpass polarizing pattern 110P1 has a significant polarization effect (linear polarization effect, for example) for light with a wavelength in the visible light range and outside the second wavelength range. More specifically, the bandpass polarizing pattern 110P1 may have an average transmittance of less than 20% for light with a wavelength outside the second wavelength range and a polarization direction parallel to the absorption axis AX of the polarizing layer 110A.

Since the bandpass polarizing pattern 110P2 has an effect on light with a wavelength within or outside the third wavelength range similar to the effect of the bandpass polarizing pattern 110P1 on light with a wavelength within or outside the second wavelength range, the same is not repeated herein.

It should be noted that the display apparatus 10A of this embodiment replaces part of the bandpass polarizing reflective patterns in FIG. 1A with the characteristics of the bandpass polarizing pattern mentioned above, which also achieves similar technical effects as the bandpass polarizing reflective patterns. For example, in addition to reducing the overall reflectance of the display apparatus 10A to ambient light, it may also prevent the display apparatus 10A from losing the energy of the internal display light due to the polarizing layer 110A and the quarter waveplate 120. In other words, the light energy utilization rate and the display quality (for example, the performance in the dark state or the display contrast) of the display apparatus 10A may be improved at the same time.

Figure 5:
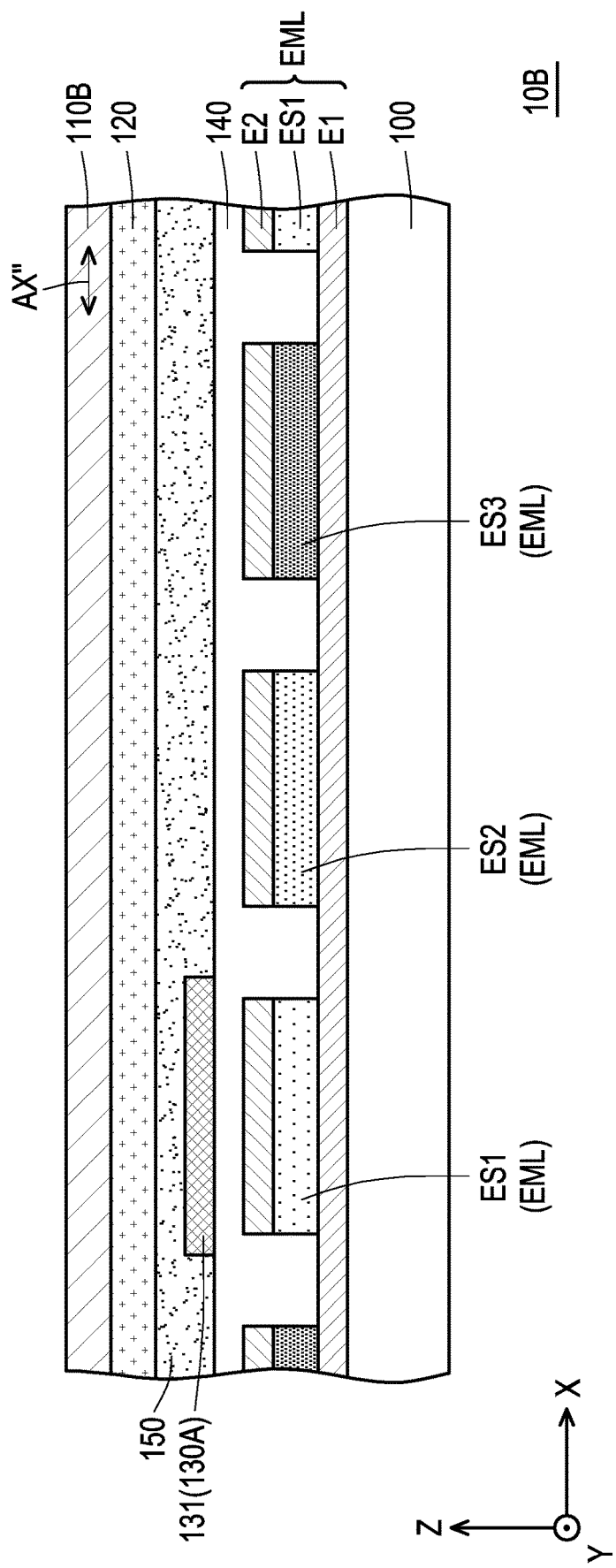
FIG. 5 is a schematic cross-sectional view of a display apparatus according to a third embodiment of the invention.

FIG. 5 is a schematic cross-sectional view of a display apparatus according to a third embodiment of the invention. The difference between the display apparatus 10B of this embodiment in FIG. 5 and the display apparatus 10 in FIG. 1A is that the polarizing layer 110B of this embodiment is a bandpass polarizing film (non-partitioned bandpass polarizing film, for example), and that this bandpass polarizing film has an absorption axis AX parallel to the direction AX". That is, the bandpass polarizing film (the polarizing layer 110B) overlaps all the light-emitting structures of the light-emitting layer EML at the same time. And the bandpass polarizing reflective layer 130A of this embodiment only has a plurality of bandpass polarizing reflective patterns 131. That is, the bandpass polarizing reflective layer 130A does not have the bandpass polarizing reflective patterns 132 and the bandpass polarizing reflective patterns 133 overlapping the light-emitting structures ES2 and the light-emitting structures ES3 as shown in FIG. 1A.

For example, in this embodiment, the polarizing layer 110B (i.e., the bandpass polarizing film) has a relatively insignificant polarization effect (linear polarization effect, for example) for light with a wavelength in the second wavelength range or third wavelength range mentioned earlier. Therefore, the maximum transmittance of the polarizing layer 110B may be greater than 45% for light with a wavelength in the second wavelength range or the third wavelength range, or even above 70%. In other words, the polarizing layer 110B does not significantly absorb light from the light-emitting structures ES2 and the light-emitting structures ES3.

On the contrary, the polarizing layer 110B has a more significant polarization effect for light with a wavelength is in the visible light range and outside the second wavelength range and the third wavelength range. More specifically, the average transmittance of the polarizing layer 110B may be less than 20% for light (for example, light in the first wavelength range) with a wavelength outside the second wavelength range and the third wavelength range and a polarization direction parallel to the absorption axis AX" of the polarizing layer 110B. Note that after passing through the bandpass polarizing reflective patterns 131, the light from the light-emitting structures ES1 forms a light with the first circular polarization state CP1 as shown in FIG. 1A. After this light passes through the quarter waveplate 120, its polarization state changes from the first circular polarization state CP1 to the first linear polarization state LP1 as shown in FIG. 1A. Therefore, light of the light-emitting structures ES1 may also pass through the polarizing layer 110B.

Since the polarizing layer 110B of this embodiment has a relatively insignificant absorption effect (i.e., the polarization effect) on the ambient light with a wavelength in the second wavelength range or the third wavelength range, the effect of suppressing the reflection of ambient light in these wavelength ranges is poor. However, compared with the display apparatus 10A in FIG. 4, the polarizing layer 110B of the embodiment is distributed over the entire surface of the light-emitting layer EML, so it may have a simplified manufacturing process.

Figure 6:
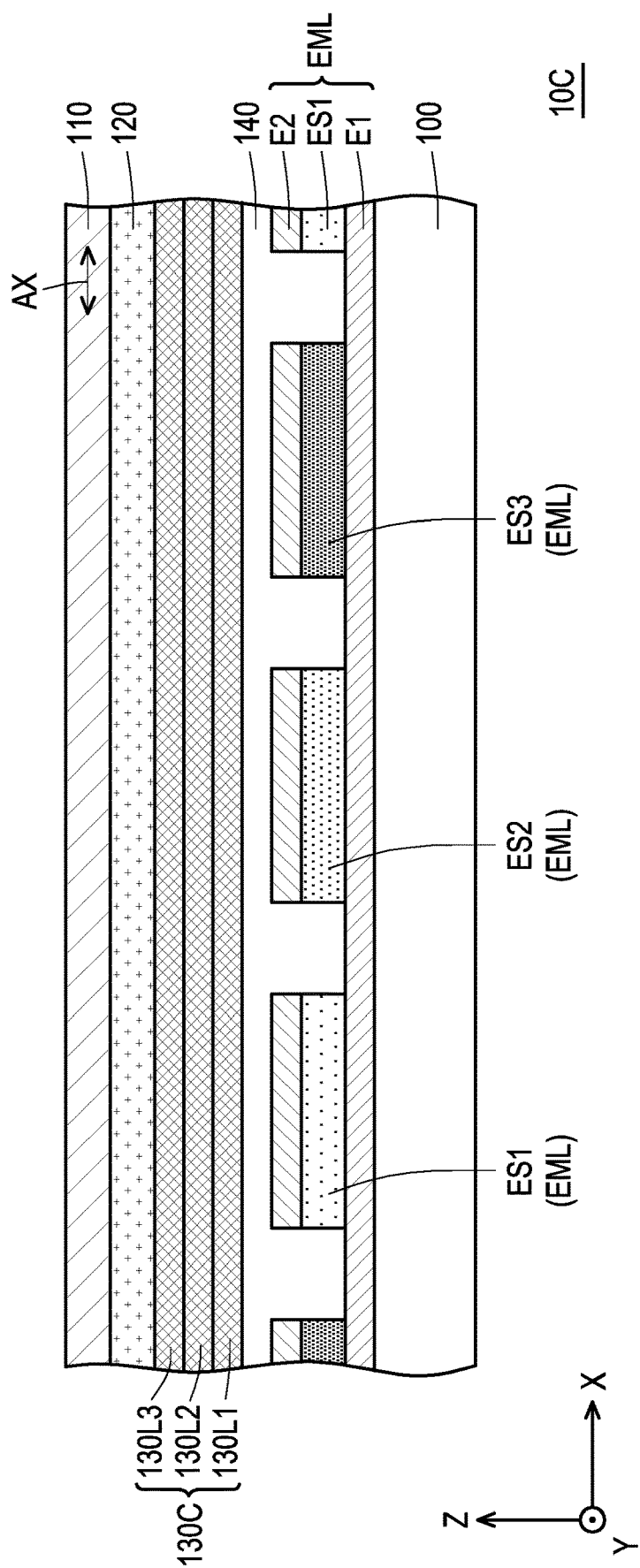
FIG. 6 is a schematic cross-sectional view of a display apparatus according to a fourth embodiment of the invention.
Figure 7:
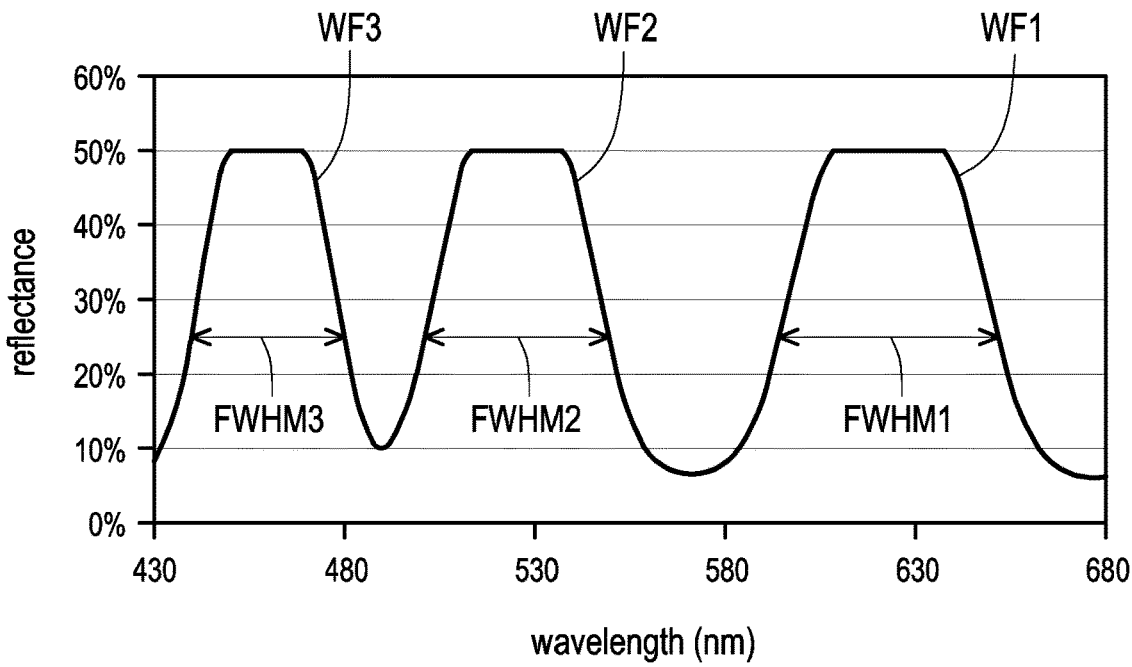
FIG. 7 is a graph showing reflectance versus wavelength of the bandpass polarizing reflective layer in FIG. 6.
Figure 8:
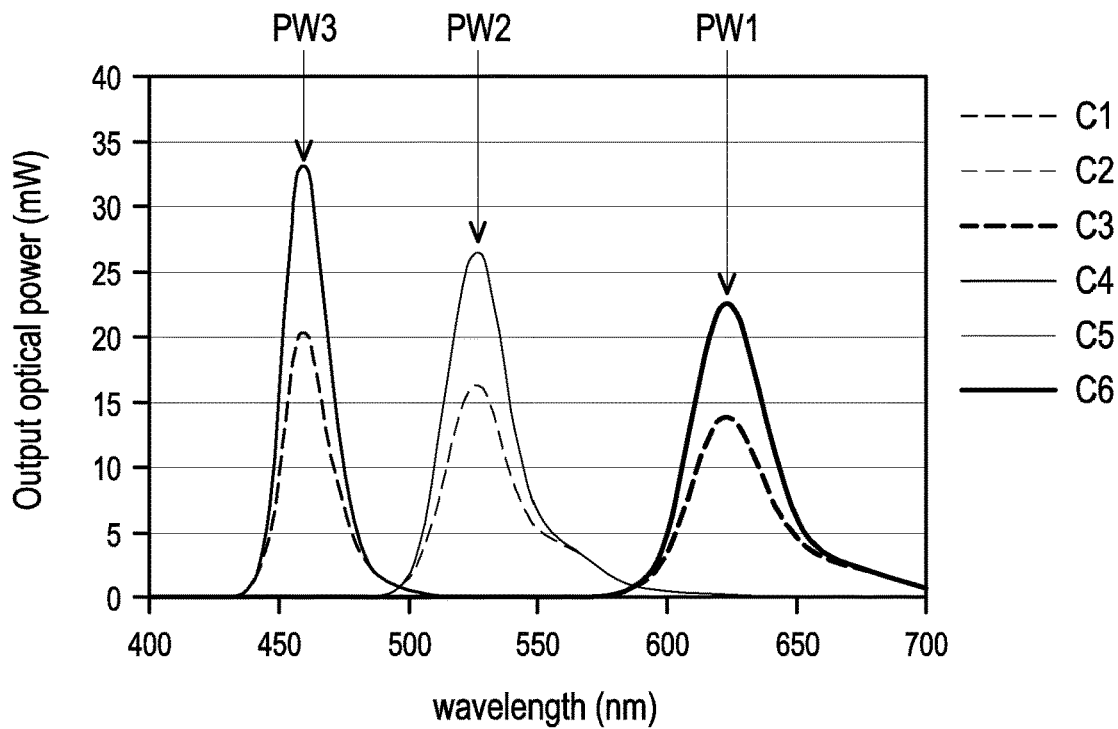
FIG. 8 is a graph showing optical power versus wavelength of the display apparatus in FIG. 6 and the display apparatus as a comparative example at different light emission wavelengths.
Figure 9:
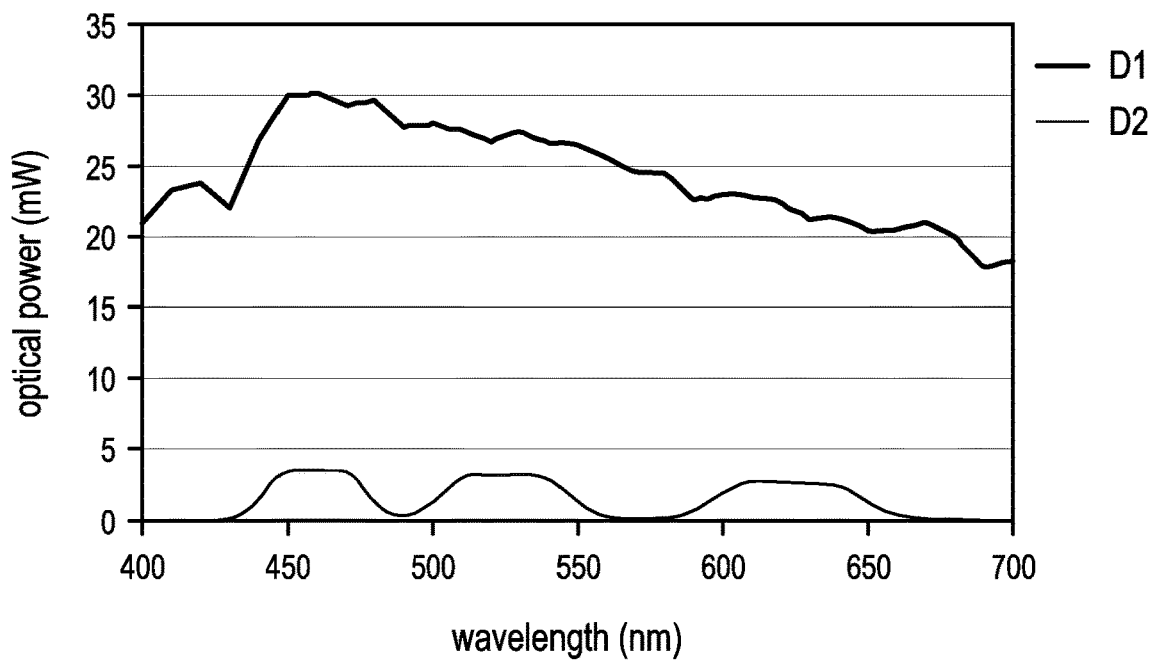
FIG. 9 is a graph showing optical power versus wavelength of the ambient light and optical power versus wavelength after the ambient light is reflected by the display apparatus in FIG. 6.
Figure 10:
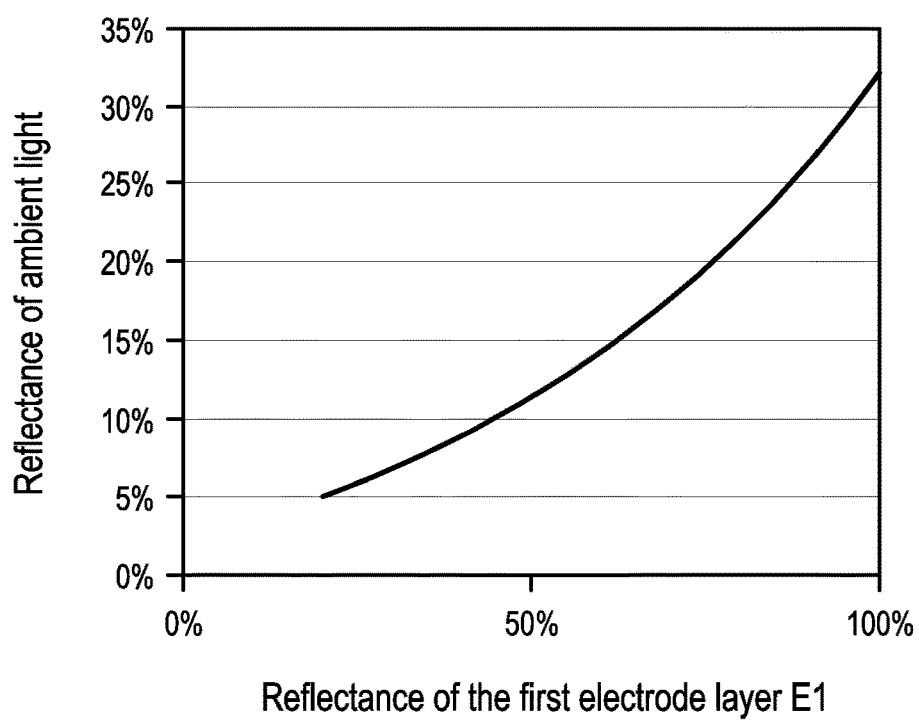
FIG. 10 is a graph showing the reflectance of the display apparatus in FIG. 6 to ambient light versus the reflectance of the reflective electrode layer therein.
Figure 11:
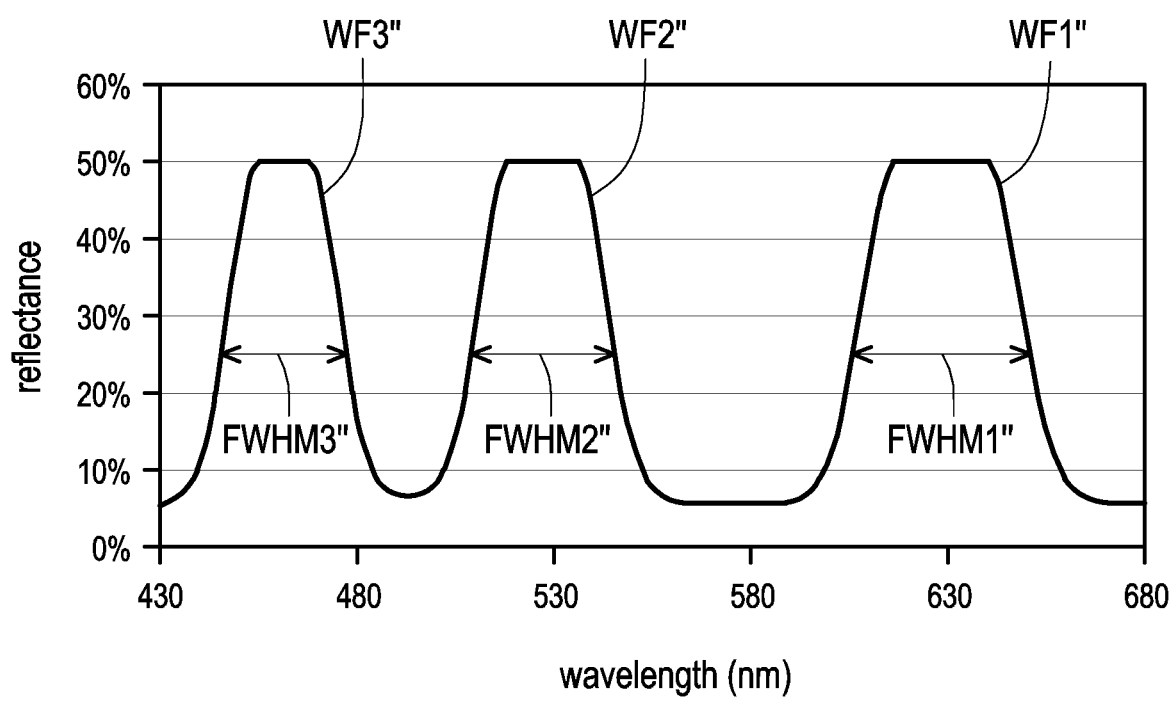
FIG. 11 is a graph showing reflectance versus wavelength of another modification of the bandpass polarizing reflective layer in FIG. 7.

FIG. 6 is a schematic cross-sectional view of a display apparatus according to a fourth embodiment of the invention. FIG. 7 is a graph showing reflectance versus wavelength of the bandpass polarizing reflective layer in FIG. 6. FIG. 8 is a graph showing optical power versus wavelength of the display apparatus in FIG. 6 and the display apparatus as a comparative example at different light emission wavelengths. FIG. 9 is a graph showing optical power versus wavelength of the ambient light and optical power versus wavelength after the ambient light is reflected by the display apparatus in FIG. 6. FIG. 10 is a graph showing the reflectance of the display apparatus in FIG. 6 to ambient light versus the reflectance of the reflective electrode layer therein. FIG. 11 is a graph showing reflectance versus wavelength of another modification of the bandpass polarizing reflective layer in FIG. 7.

The difference between the display apparatus 10C in FIG. 6 of this embodiment and the display apparatus 10 in FIG. 2A lies in the configuration of the bandpass polarizing reflective layer. Specifically, the bandpass polarizing reflective layer 130C of the display apparatus 10C may include a first bandpass polarizing reflective layer 130L1 (bandpass polarizing reflective patterns), a second bandpass polarizing reflective layer 130L2, and a third bandpass polarizing reflective layer 130L3.

In this embodiment, since the optical characteristics of the first bandpass polarizing reflective layer 130L1, the second bandpass polarizing reflective layer 130L2, and the third bandpass polarizing reflective layer 130L3 are respectively similar to the bandpass polarizing reflective patterns 131, the bandpass polarizing reflective patterns 132, and the bandpass polarizing reflection patterns 133 in FIG. 1A, please refer to the relevant paragraphs of the foregoing embodiment for the detailed description, which is not repeated here.

Compared with the bandpass polarizing reflective layer 130 in FIG. 1A, in this embodiment, the bandpass polarizing reflective layer 130C distributed over the entire surface replaces the bandpass polarizing reflective patterns in FIG. 1A. In other words, the first bandpass polarizing reflective layer 130L1 overlaps the light-emitting structures ES1 and the light-emitting structures ES2, and the first bandpass polarizing reflective layer 130L1 and the second bandpass polarizing reflective layer 130L2 overlap each other. Therefore, there is no need to adjust the structural design of the bandpass polarizing reflective layers to correspond to different light-emitting structures designs, a configuration that helps simplify the design and the manufacturing process of the display apparatus 10C.

It is worth mentioning that the polarizing layer 110 in FIG. 6 may also use a bandpass polarizing film. For example, when the second bandpass polarizing reflective layer 130L2 is capable of reflecting the light of the light-emitting structures ES2, if the bandpass polarizing film does not polarize the light of the light-emitting structures ES2 evidently, the reflectance of the second bandpass polarizing reflective layer in the second wavelength range may be less than 20%. Specifically, the light-emitting structures ES2 of the display apparatus 10C have a peak emission wavelength. The peak emission wavelength of the light-emitting structures ES2 is different from the peak emission wavelength of the light-emitting structures ES1. The first bandpass polarizing reflective layer 130L1 (bandpass polarizing reflective patterns) overlaps the light-emitting structures ES1 and the light-emitting structures ES2. The polarizing layer 110 is a bandpass polarizing film, and the polarizing layer 110 also overlaps the light-emitting structures ES1 and the light-emitting structures ES2 and has an absorption axis AX. The maximum transmittance of the polarizing layer 110 is greater than 45% for light with a wavelength in the second wavelength range. The second wavelength range is the peak emission wavelength of the light-emitting structures ES2 ±10 nm. The average transmittance of the polarizing layer 110 is less than 20% for light with a wavelength outside the second wavelength range and a polarization direction parallel to the absorption axis AX.

In another embodiment, the bandpass polarizing film replaces one of the bandpass polarizing reflective layers. For example, when the second bandpass polarizing reflective layer 130L2 is capable of reflecting the light of the light-emitting structures ES2, if the bandpass polarizing film does not polarize the light of the light-emitting structures ES2 evidently, the bandpass polarizing film may replace the second bandpass polarizing reflective layer 130L2, which further reduces the cost and thickness.

Please refer to FIG. 6 to FIG. 8 at the same time. In this embodiment, the reflection spectrum (curve) of the bandpass polarizing reflective layer 130C includes a waveform WF1 covering the peak emission wavelength of the light-emitting structures ES1, a waveform WF2 covering the peak emission wavelength of the light-emitting structures ES2, and a waveform WF3 covering the peak emission wavelength of the light-emitting structures ES3. In order to achieve a technical effect similar to the embodiment in FIG. 1A, that is, to improve the light energy utilization rate and the display quality of the display apparatus 10C (for example, its performance in the dark state or the display contrast), the full width at half maximum (FWHM) of the waveform WF1, the waveform WF2, and the waveform WF3 are less than 100 nm, and preferably less than 50 nm. For example, as shown in FIG. 7, the FWHM1 of the waveform WF1 is about 54 nm, the FWHM2 of the waveform WF2 is about 46 nm, and the FWHM3 of the waveform WF3 is about 40 nm.

On the other hand, the difference between any two of the peak emission wavelength PW1 of the light-emitting structures ES1, the peak emission wavelength PW2 of the light-emitting structures ES2, and the peak emission wavelength PW3 of the light-emitting structures ES3 is greater than 30 nm (as shown in FIG. 8). For example, in this embodiment, the peak emission wavelengths of the light-emitting structures ES1, the light-emitting structures ES2, and the light-emitting structures ES3 are respectively 623 nm, 525 nm, and 460 nm.

FIG. 8 shows a comparison of the output optical power of the display apparatus 10C of this embodiment and a display apparatus as a comparative example in different wavelength ranges. The curve C1, the curve C2, and the curve C3 respectively represent the distribution of output optical power versus wavelength in the first wavelength range, the second wavelength range, and the third wavelength range of the display apparatus of the comparative example (without the bandpass polarizing reflective layer 130C), whereas the curve C4, the curve C5, and the curve C6 respectively represent the distribution of output optical power versus wavelength of the display apparatus 10C of this embodiment in the first wavelength range, the second wavelength range, and the third wavelength range. It can be seen from FIG. 8 that the display apparatus 10C of this embodiment has a significantly better output optical power in any wavelength range due to the bandpass polarizing reflective layer 130C.

On the other hand, the curve D1 in FIG. 9 shows the distribution of optical power versus wavelength of a D65 ambient light, whereas the curve D2 shows the reflected light spectrum obtained after the D65 ambient light is irradiated on the display apparatus 10C of this embodiment. It can be seen from FIG. 9 that the brightness of the D65 ambient light attenuates up to 90% after the D65 ambient light is reflected by the display apparatus 10C.

Furthermore, in this embodiment, the reflectance of the first electrode layer E1 is between 30% and 80%. Since part of the ambient light in the display apparatus undergoes two reflections of the first electrode layer E1 (as shown in FIG. 1C), reducing the reflectance of the first electrode layer E1 suppresses the overall reflectance of the display apparatus to ambient light effectively. As shown in FIG. 10, the reflectance of the display apparatus 10C to ambient light is positively correlated with the reflectance of the first electrode layer E1.

Please refer to FIG. 2 and FIG. 6 at the same time. In this embodiment, a reflection bandwidth of the bandpass polarizing reflective layer 130C is positively correlated with the refractive index anisotropy and the pitch P of the cholesteric liquid crystal layer LCL (as shown in FIG. 2). Therefore, a narrower reflection bandwidth may be obtained by adjusting the characteristics of the cholesteric liquid crystal layer LCL (for example, reducing the pitch P). As shown in FIG. 11, the adjusted bandpass polarizing reflective layer has a full width at half maximum FWHM1" of a waveform WF1" about 42 nm, a full width at half maximum FWHM2" of a waveform WF2" about 35 nm, and a half-maximum width FWHM3" of a waveform WF3" about 31 nm. Accordingly, the output optical power of the display apparatus may be further increased. For example, the brightness gain may be increased by about 40% compared to the aforementioned comparative example (that is, a display apparatus without a bandpass polarizing reflective layer), and the reflectance of the display apparatus to the D65 ambient light may be reduced to 10%.

Figure 12:
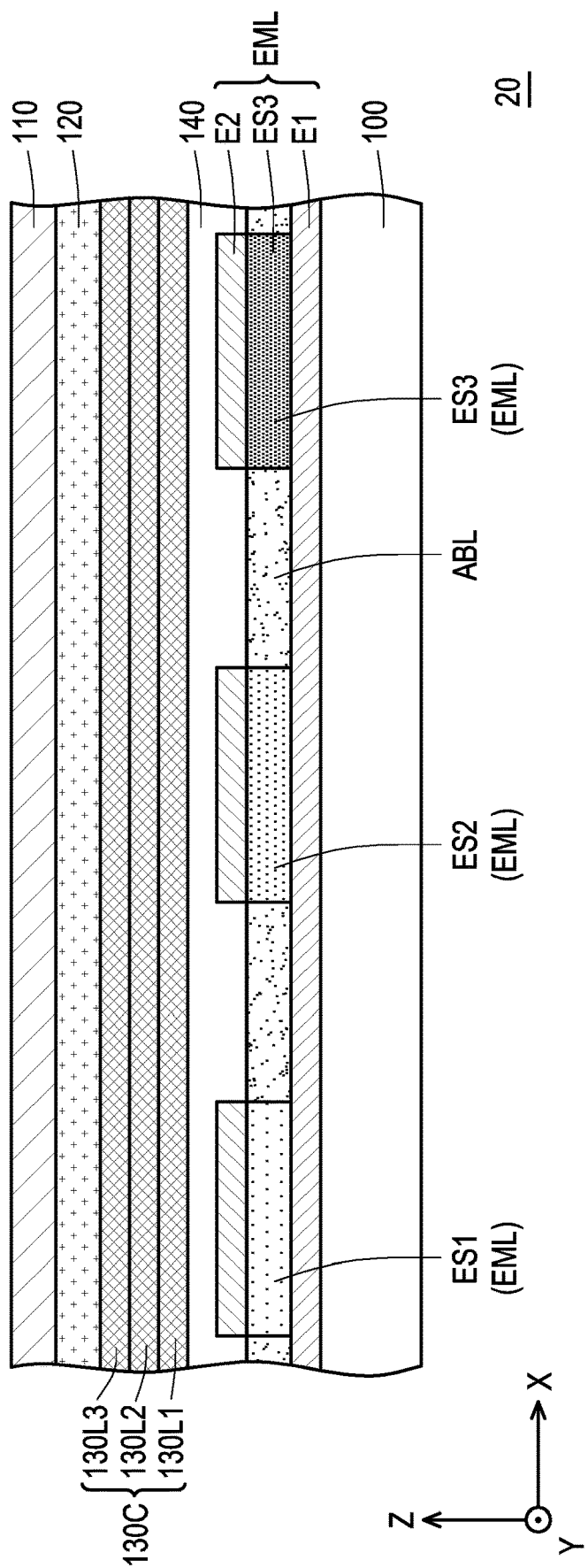
FIG. 12 is a schematic cross-sectional view of a display apparatus according to a fifth embodiment of the present invention.

FIG. 12 is a schematic cross-sectional view of a display apparatus according to a fifth embodiment of the present invention. The difference between the display apparatus 20 of this embodiment in FIG. 12 and the display apparatus 10C in FIG. 6 is that the display apparatus 20 of this embodiment further includes a light-absorbing layer ABL, which is disposed between the light-emitting structures of a light-emitting layer EML and is located between a bandpass polarizing reflective layer 130C and a circuit substrate 100. The material of the light-absorbing layer ABL includes, for example, black resin material or black metal. The absorption characteristics of the light-absorbing layer ABL in the visible light band may further reduce the overall reflectance of the display apparatus 20 to ambient light.

Figure 13:
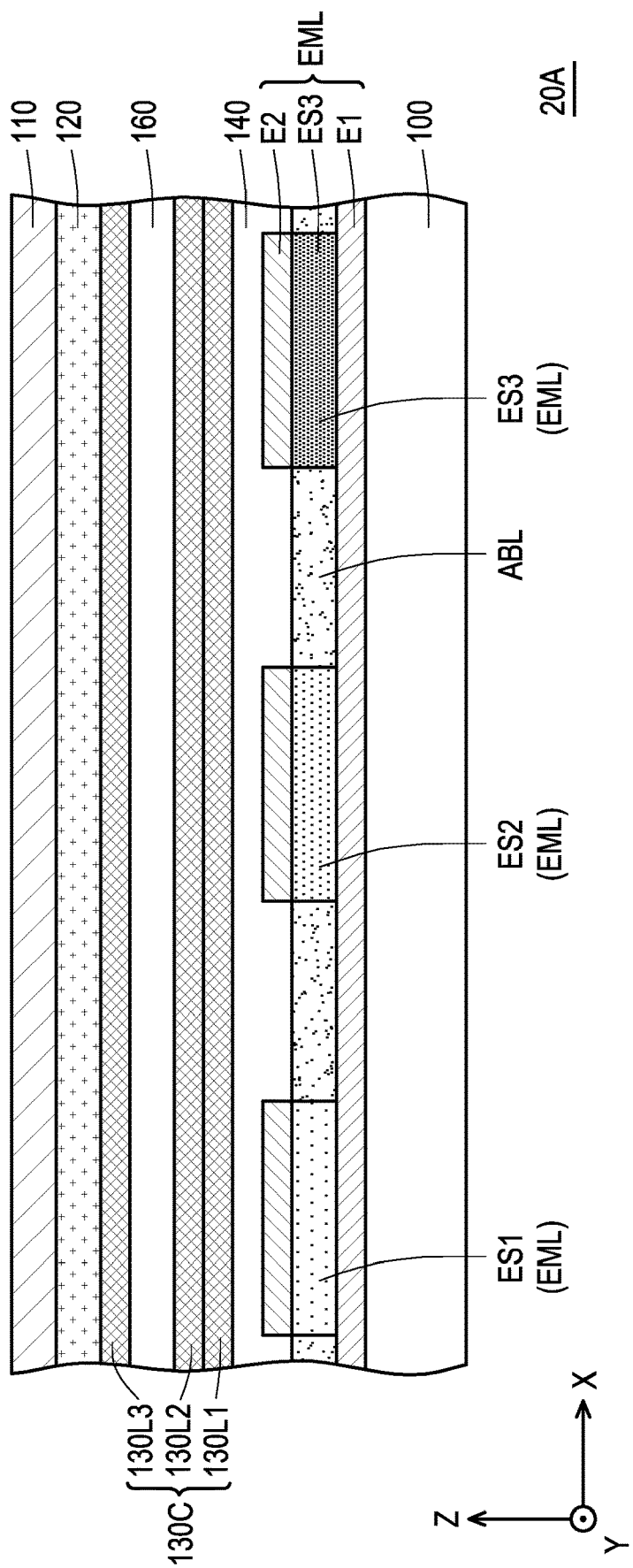
FIG. 13 is a schematic cross-sectional view of a display apparatus according to a sixth embodiment of the present invention.

FIG. 13 is a schematic cross-sectional view of a display apparatus according to a sixth embodiment of the present invention. The difference between the display apparatus 20A of this embodiment in FIG. 13 and the display apparatus 20 in FIG. 12 is that the display apparatus 20A further includes a dimming layer 160 disposed between a bandpass polarizing reflective layer 130C and a light-absorbing layer ABL. It should be noted that the dimming layer 160 of the display apparatus 20A is disposed between the second bandpass polarizing reflective layer 130L2 and the third bandpass polarizing reflective layer 130L3. The material of the dimming layer 160 includes, for example, optical clear adhesive (OCA) or curable optical clear resin (OCR).

In this embodiment, the reflectance of the first bandpass polarizing reflective layer 130L1 is greater than 20% for light with a wavelength in the first wavelength range, and the first wavelength range is, for example, the wavelength range of red light (for example, 610 nm to 630 nm). The reflectance of the second bandpass polarizing reflective layer 130L2 is greater than 20% for light with a wavelength in the second wavelength range, and the second wavelength range is, for example, the wavelength range of green light (for example, 515 nm to 535 nm). The reflectance of the third bandpass polarizing reflective layer 130L3 is greater than 20% for light with a wavelength in the third wavelength range, and the third wavelength range is, for example, the wavelength range of blue light (for example, 450 nm to 470 nm).

For example, in this embodiment, the first bandpass polarizing reflective layer 130L1 suitable for reflecting red light, the second bandpass polarizing reflective layer 130L2 suitable for reflecting green light, and the third bandpass polarizing reflective layer 130L3 suitable for reflecting blue light are disposed in sequence (the second bandpass polarizing reflective layer 130L2 is disposed between the third bandpass polarizing reflective layer 130L3 and the light-emitting layer EML) on the light-emitting layer EML. Therefore, the dimming layer 160 provided between the second bandpass polarizing reflective layer 130L2 and the third bandpass polarizing reflective layer 130L3 may increase the chance for blue light to be incident on the light-absorbing layer ABL after being reflected by the third bandpass polarizing reflective layer 130L3, which alleviates the problem of observing a blue display screen when the display apparatus 20A is viewed at an oblique angle. To put it in another way, the said configuration of the light-absorbing layer ABL and the light-adjusting layer 160 reduces the range of the emission angle of blue light.

Furthermore, the dimming layer 160 may also be selectively doped with materials that absorb blue light. Since the obliquely incident blue light has a longer light path in the dimming layer 160, the absorption effect is better than that of a normal incident blue light, which further improves the issue of the blue cast of the display image and the absorption of external blue light by the display apparatus.

Figure 14:
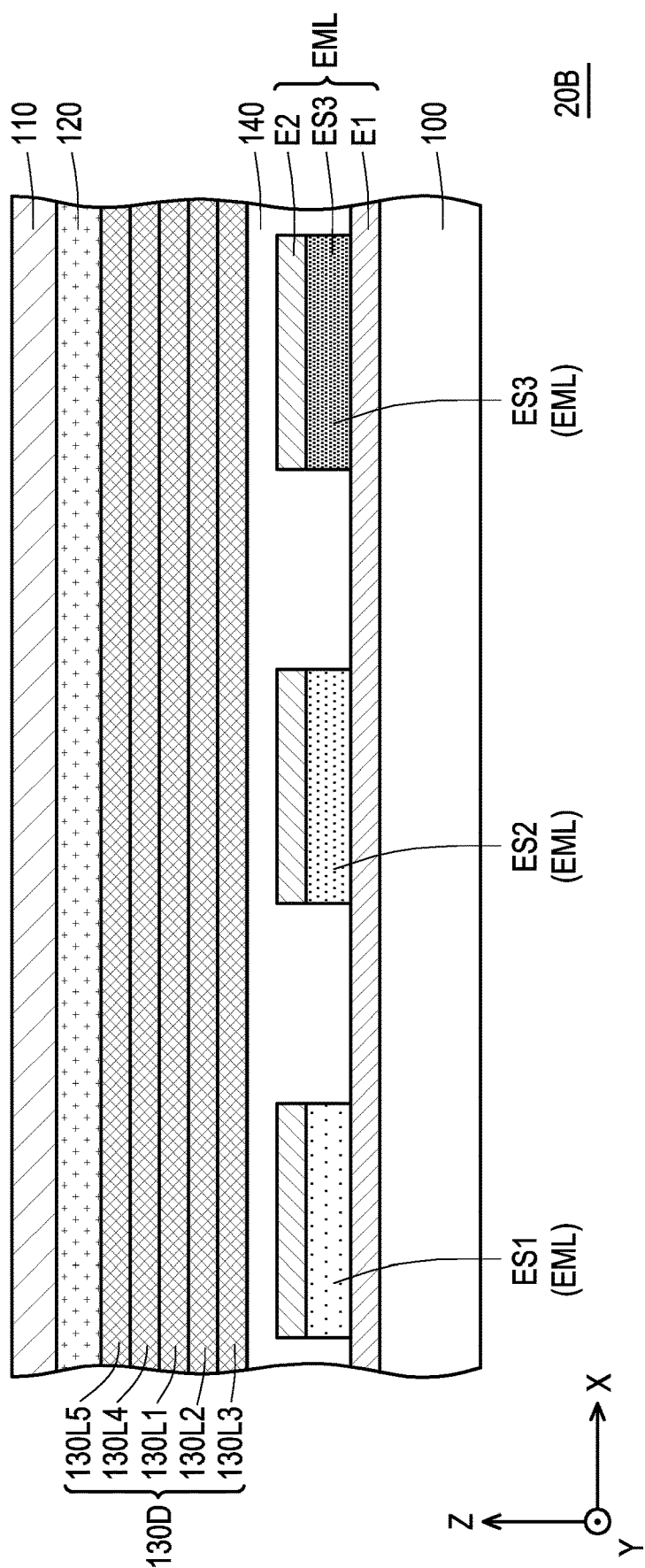
FIG. 14 is a schematic cross-sectional view of a display apparatus according to a seventh embodiment of the present invention.

FIG. 14 is a schematic cross-sectional view of a display apparatus according to a seventh embodiment of the invention. The difference between the display apparatus 20B of this embodiment in FIG. 14 and the display apparatus 10C in FIG. 6 lies in the configuration of the stacking structure of the bandpass polarizing reflective layers. Specifically, the bandpass polarizing reflective layer 130D of the display apparatus 20B further includes an auxiliary bandpass polarizing reflective layer 130L4 and an auxiliary bandpass polarizing reflective layer 130L5 that are disposed between a first bandpass polarizing reflective layer 130L1 and a quarter waveplate 120 (or a polarizing layer 110). These auxiliary bandpass polarizing reflective layers overlap a plurality of light-emitting structures of the light-emitting layer EML. The auxiliary bandpass polarizing reflective layer 130L4 is located between a third bandpass polarizing reflective layer 130L3 and the auxiliary bandpass polarizing reflective layer 130L5. Also, the configuration order of the first bandpass polarizing reflective layer 130L1, the second bandpass polarizing reflective layer 130L2, and the third bandpass polarizing reflective layer 130L3 of this embodiment is opposite to that of the display apparatus 10C in FIG. 6.

Note that the auxiliary bandpass polarizing reflective layer has at least one auxiliary reflection peak for the wavelength in an auxiliary wavelength range. The reflectance of light within the auxiliary reflection peak ±10 nm is greater than 10%, and the auxiliary wavelength range falls between 650 nm and 770 nm. For example, in this embodiment, the auxiliary wavelength range of the auxiliary bandpass polarizing reflective layer 130L4 suitable for reflecting light is, for example, the range of 670 nm to 690 nm (that is, deep red light), and the auxiliary wavelength range of the auxiliary bandpass polarizing reflective layer 130L5 suitable for reflecting light is, for example, a range of 730 nm to 750 nm (i.e., near-infrared light), but it is not limited thereto. More specifically, the difference between the peak reflection wavelength of the auxiliary bandpass polarizing reflective layer 130L4 and the peak reflection wavelength (for example, 620 nm) of the first bandpass polarizing reflective layer 130L1 is greater than or equal to 60 nm, and the difference between the peak reflection wavelength of the auxiliary bandpass polarizing reflective layer 130L5 and the peak reflection wavelength of the auxiliary bandpass polarizing reflective layer 130L4 is greater than or equal to 60 nm.

Since the reflection spectrum of the bandpass polarizing reflective layer 130D changes with different incident angles of light (for example, the peak wavelength of the light suitable for being reflected decreases as the incident angle increases), the main frequency of the reflection band of the bandpass polarizing reflective layer 130D exhibits a blue shift.

For example, blue light that is non-normally incident on the third bandpass polarizing reflective layer 130L3 and cannot be effectively reflected is reflected by the second bandpass polarizing reflective layer 130L2. The green light that is non-normally incident on the second bandpass polarizing reflective layer 130L2 and cannot be effectively reflected is reflected by the first bandpass polarizing reflective layer 130L1. The red light that is non-normally incident on the first bandpass polarizing reflective layer 130L1 and cannot be effectively reflected is reflected by the auxiliary bandpass polarizing reflective layer 130L4. And the deep red light that is non-normally incident on the auxiliary bandpass polarizing reflective layer 130L4 and cannot be effectively reflected is reflected by the auxiliary bandpass polarizing reflective layer 130L5. In order to ensure that the display image does not exhibit colour cast, the reflectance difference of different wavelengths in the invention is less than 5%, preferably less than 2%, at the same angle. For example, the reflectance of red light is 10% at an elevation angle of 60 degrees, and the reflectance of blue and green light is within the range of 5% to 15%, and the preferred range is 8% to 12%.

Therefore, the stacking structure of the bandpass polarizing reflective layer 130D may suppress the color shifts of the display screen of the display apparatus 20B when viewed at a large viewing angle, which helps improve the display quality.

Figure 15:
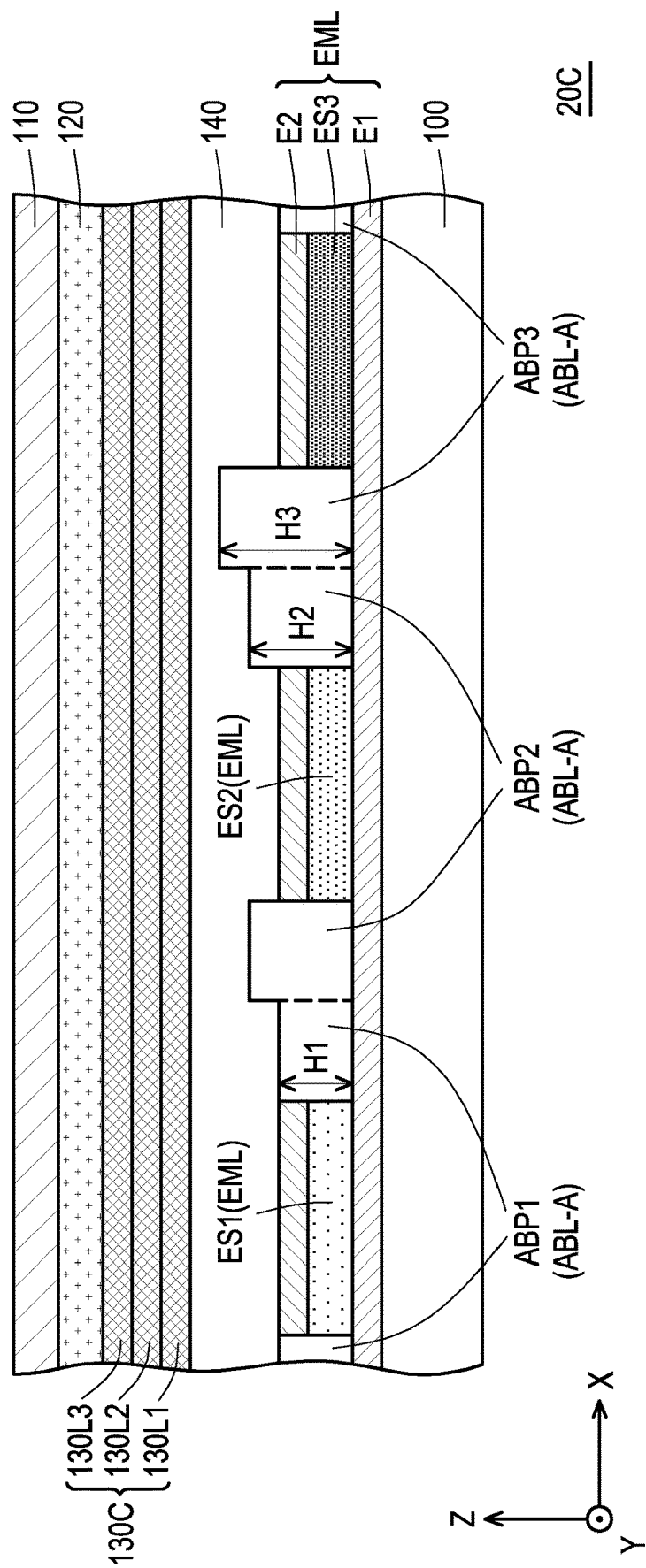
FIG. 15 is a schematic cross-sectional view of a display apparatus according to an eighth embodiment of the invention.

FIG. 15 is a schematic cross-sectional view of a display apparatus according to an eighth embodiment of the invention. The difference between the display apparatus 20C of this embodiment in FIG. 15 and the display apparatus 20 in FIG. 12 lies in the configuration of the light-absorbing layer. Specifically, the light-absorbing layer ABL-A of the display apparatus 20C has a plurality of light-absorbing patterns ABP1, a plurality of light-absorbing patterns ABP2, and a plurality of light-absorbing patterns ABP3. The light-absorbing patterns ABP1, the light-absorbing patterns ABP2, and the light-absorbing patterns ABP3 may be alternately disposed along the direction X.

For example, in this embodiment, the light-absorbing patterns ABP1, the light-absorbing patterns ABP2, and the light-absorbing patterns ABP3 are respectively disposed around the light-emitting structures ES1, the light-emitting structures ES2, and the light-emitting structures ES3 of the light-emitting layer EML, but it is not limited thereto. In other embodiments, the light-absorbing patterns of the light-absorbing layer may also be disposed corresponding to the light-emitting structures in other ways.

It should be noted that the light-absorbing patterns of the light-absorbing layer ABL-A have different heights corresponding to the light-emitting structures with different peak emission wavelengths. For example, a height H1 of the light-absorbing pattern ABP1 corresponding to the light-emitting structures ES1 may be less than a height H2 of the light-absorbing pattern ABP2 corresponding to the light-emitting structures ES2, and the height H2 of the light-absorbing pattern ABP2 may be less than a height H3 of the light-absorbing pattern ABP3 corresponding to the light-emitting structures ES3. The height here refers to, for example, the thickness of the light-absorbing pattern along a direction perpendicular to the circuit substrate 100 (for example, the direction Z).

Like the display apparatus 20 in FIG. 12, the third bandpass polarizing reflective layer 130L3 is farther away from the light-emitting layer EML than other bandpass polarizing reflective layers. Therefore, the blue light incident on the third bandpass polarizing reflective layer 130L3 at a large angle (obliquely incident) may be shielded effectively by setting the height H3 of the light-absorbing pattern ABP3 higher than other light-absorbing patterns, which alleviates the problem of observing a blue cast image when the display apparatus 20C is viewed at an oblique viewing angle.

Note that the heights of the light-absorbing pattern of the light-absorbing layer ABL-A corresponding to the light-emitting structures with different peak emission wavelengths is adjusted based on the stacking sequence of the bandpass polarizing reflective layers corresponding to different peak reflection wavelengths, and the invention is not limited by the content disclosed in the drawings. For example, when the second bandpass polarizing reflective layer 130L2 is disposed between the third bandpass polarizing reflective layer 130L3 and the quarter waveplate 120, the height of the light-absorbing pattern corresponding to the light-emitting structures ES2 may also be greater than the respective height of the two light-absorbing patterns corresponding to the light-emitting structures ES1 and the light-emitting structures ES3.

In summary, in the display apparatus of an embodiment of the present invention, a bandpass polarizing reflective layer is provided between the quarter waveplate and the light-emitting layer and is adapted to overlap the light-emitting structures. The first bandpass polarizing reflective pattern of the bandpass polarizing reflective layer has a reflectance greater than 20% for light in a specific wavelength range. Accordingly, the overall reflectance of the display apparatus to ambient light may be reduced effectively, and the light energy loss of the internal display light of the polarizing layer may be reduced, thereby improving the light energy utilization rate and the performance of the display apparatus in the dark state.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus, comprising:
a circuit substrate;
a light-emitting layer, disposed on the circuit substrate and comprising a plurality of light-emitting structures, wherein the light-emitting structures are electrically connected to the circuit substrate, the light-emitting structures comprise a plurality of first light-emitting structures, and the first light-emitting structures have a first peak emission wavelength;
a polarizing layer, overlapping the light-emitting layer and located on a side of the light-emitting layer away from the circuit substrate;
a quarter waveplate, disposed between the polarizing layer and the light-emitting layer, and adapted to overlap the light-emitting layer and the polarizing layer; and
a bandpass polarizing reflective layer, disposed between the quarter waveplate and the light-emitting layer, comprising a first bandpass polarizing reflective pattern overlapping the first light-emitting structures, wherein a reflectance of the first bandpass polarizing reflective pattern for light with a wavelength in a first wavelength range is greater than 20%, the first wavelength range is the first peak emission wavelength ±10 nm, the bandpass polarizing reflective layer further comprises a second bandpass polarizing reflective pattern, the light-emitting structures further comprise a plurality of second light-emitting structures, the second light-emitting structures have a second peak emission wavelength, the first peak emission wavelength is different from the second peak emission wavelength, the second bandpass polarizing reflective pattern overlaps the second light-emitting structures, a reflectance of the second bandpass polarizing reflective pattern for light with a wavelength in a second wavelength range is greater than 20%, the second wavelength range is the second peak emission wavelength ±10 nm, and the first bandpass polarizing reflective pattern does not overlap the second bandpass polarizing reflective pattern.

2. The display apparatus according to claim 1, wherein the bandpass polarizing reflective layer comprises a cholesteric liquid crystal layer, the cholesteric liquid crystal layer has a plurality of liquid crystal molecules, and the liquid crystal molecules form a helical twist having a pitch.

3. The display apparatus according to claim 1, wherein: the light-emitting structures further comprise a plurality of second light-emitting structures; the second light-emitting structures have a second peak emission wavelength; the polarizing layer has a plurality of openings overlapping the second light-emitting structures; a plurality of bandpass polarizing patterns are provided in the openings; the bandpass polarizing patterns and the polarizing layer have an absorption axis; and a maximum transmittance for light with a wavelength in a second wavelength range is greater than 45%; the second wavelength range is the second peak emission wavelength ±10 nm; and in the range of visible light, the bandpass polarizing patterns have an average transmittance of less than 20% for light with a wavelength outside the second wavelength range and a polarization direction parallel to the absorption axis.

4. The display apparatus according to claim 1, wherein the light-emitting structures further comprise a plurality of second light-emitting structures, the second light-emitting structures have a second peak emission wavelength, the second peak emission wavelength is different from the first peak emission wavelength, the polarizing layer overlaps the first light-emitting structures and the second light-emitting structures and has an absorption axis, a maximum transmittance of the polarizing layer for light in a second wavelength range is greater than 45%, the second wavelength range is the second peak emission wavelength ±10 nm, and an average transmittance of the polarizing layer is less than 20% for light with a wavelength outside the second wavelength range and a polarization direction parallel to the absorption axis.

5. The display apparatus according to claim 1, wherein the light-emitting structures further comprise a plurality of second light-emitting structures, the second light-emitting structures have a second peak emission wavelength, the second peak emission wavelength is different from the first peak emission wavelength, the bandpass polarizing reflective layer further comprises a second bandpass polarizing reflective layer, the first bandpass polarizing reflective pattern overlaps the first light-emitting structures and the second light-emitting structures, the first bandpass polarizing reflective pattern and the second bandpass polarizing reflective layer overlap each other, a reflectance of the second bandpass polarizing reflective layer is greater than 20% for light with a wavelength in a second wavelength range, and the second wavelength range is the second peak emission wavelength ±10 nm.

6. The display apparatus according to claim 5, wherein a difference between the first peak emission wavelength and the second peak emission wavelength is greater than 30 nm.

7. The display apparatus according to claim 5, wherein a reflection spectrum of the bandpass polarizing reflective layer comprises a first waveform covering the first peak emission wavelength and a second waveform covering the second peak emission wavelength, and a full width at half maximum of the first waveform and the second waveform is respectively less than 50 nm.

8. The display apparatus according to claim 1, wherein the light-emitting structures further comprise a plurality of second light-emitting structures, the second light-emitting structures have a second peak emission wavelength, the second peak emission wavelength is different from the first peak emission wavelength, the first bandpass polarizing reflective pattern overlaps the first light-emitting structures and the second light-emitting structures, the polarizing layer is a bandpass polarizing film, the polarizing layer overlaps the first light-emitting structures and the second light-emitting structures and has an absorption axis, a maximum transmittance of the polarizing layer is greater than 45% for light in a second wavelength range, the second wavelength range is the second peak emission wavelength ±10 nm, and an average transmittance of the polarizing layer is less than 20% for light with a wavelength outside the second wavelength range and a polarization direction parallel to the absorption axis.

9. A display apparatus, comprising:
a circuit substrate;
a light-emitting layer, disposed on the circuit substrate and comprising a plurality of light-emitting structures, wherein the light-emitting structures are electrically connected to the circuit substrate, the light-emitting structures comprise a plurality of first light-emitting structures, and the first light-emitting structures have a first peak emission wavelength;
a polarizing layer, overlapping the light-emitting layer and located on a side of the light-emitting layer away from the circuit substrate;
a quarter waveplate, disposed between the polarizing layer and the light-emitting layer, and adapted to overlap the light-emitting layer and the polarizing layer; and
a bandpass polarizing reflective layer, disposed between the quarter waveplate and the light-emitting layer, comprising a first bandpass polarizing reflective pattern overlapping the first light-emitting structures, wherein a reflectance of the first bandpass polarizing reflective pattern for light with a wavelength in a first wavelength range is greater than 20%, and the first wavelength range is the first peak emission wavelength ±10 nm,
wherein the bandpass polarizing reflective layer comprises:
a cholesteric liquid crystal layer, the cholesteric liquid crystal layer has a plurality of liquid crystal molecules, and the liquid crystal molecules form a helical twist having a pitch;
a substrate,
wherein the cholesteric liquid crystal layer is disposed on the substrate; and
a plurality of surface microstructures, disposed between the substrate and the cholesteric liquid crystal layer, wherein inclination angles of molecular long axes of part of the liquid crystal molecules overlapping the surface microstructures with respect to the substrate are different from each other.

10. A display apparatus, comprising:
a circuit substrate;
a light-emitting layer, disposed on the circuit substrate and comprising a plurality of light-emitting structures, wherein the light-emitting structures are electrically connected to the circuit substrate, the light-emitting structures comprise a plurality of first light-emitting structures, and the first light-emitting structures have a first peak emission wavelength;
a polarizing layer, overlapping the light-emitting layer and located on a side of the light-emitting layer away from the circuit substrate;
a quarter waveplate, disposed between the polarizing layer and the light-emitting layer, and adapted to overlap the light-emitting layer and the polarizing layer;
a bandpass polarizing reflective layer, disposed between the quarter waveplate and the light-emitting layer, comprising a first bandpass polarizing reflective pattern overlapping the first light-emitting structures, wherein a reflectance of the first bandpass polarizing reflective pattern for light with a wavelength in a first wavelength range is greater than 20%, and the first wavelength range is the first peak emission wavelength ±10 nm, and
a light-absorbing layer, disposed between the light-emitting structures, and located between the bandpass polarizing reflective layer and the circuit substrate.

11. The display apparatus according to claim 10, further comprising:
a dimming layer, disposed between the bandpass polarizing reflective layer and the light-absorbing layer.

12. The display apparatus according to claim 10, wherein the light-emitting structures further comprise a plurality of second light-emitting structures, the second light-emitting structures have a second peak emission wavelength, the second peak emission wavelength is different from the first peak emission wavelength, the light-absorbing layer has a plurality of first light-absorbing patterns disposed corresponding to the first light-emitting structures and a plurality of second light-absorbing patterns disposed corresponding to the second light-emitting structures, the second peak emission wavelength is greater than the first peak emission wavelength, and a first height of each of the first light-absorbing patterns along a direction perpendicular to the circuit substrate is different from a second height of each of the second light-absorbing patterns along the direction.

13. The display apparatus according to claim 5, wherein the bandpass polarizing reflective layer further comprises an auxiliary bandpass polarizing reflective layer, the auxiliary bandpass polarizing reflective layer overlaps the first light-emitting structures and the second light-emitting structures, the auxiliary bandpass polarizing reflective layer is located between the polarizing layer and the second bandpass polarizing reflective layer, the auxiliary bandpass polarizing reflective layer has at least one auxiliary reflection peak for wavelengths within an auxiliary wavelength range, a reflectance of light within the at least one auxiliary reflection peak ±10 nm is greater than 10%, and the auxiliary wavelength range falls within a range of 650 nm to 770 nm.

* * * * *